(12) United States Patent
Aekins et al.

(10) Patent No.: US 7,601,034 B1
(45) Date of Patent: Oct. 13, 2009

(54) MODULAR INSERT AND JACK INCLUDING MOVEABLE REACTANCE SECTION

(75) Inventors: Robert A. Aekins, Quaker Hill, CT (US); Mark E. Martich, Pawcatuck, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 12/116,361

(22) Filed: May 7, 2008

(51) Int. Cl.
H01R 24/00 (2006.01)
(52) U.S. Cl. ........................... 439/676; 439/941
(58) Field of Classification Search ................ 439/676, 439/941, 620.11, 620.17, 620.23
See application file for complete search history.

(56) References Cited

U.S. PATENT DOCUMENTS

| | | |
|---|---|---|
| 4,224,485 A | 9/1980 | Krumreich |
| 4,262,981 A | 4/1981 | Goodman |
| 4,633,048 A | 12/1986 | Komatsu |
| 4,676,576 A | 6/1987 | Feldberg et al. |
| 4,695,115 A | 9/1987 | Talend |
| 4,699,443 A | 10/1987 | Goodrich et al. |
| 4,927,373 A | 5/1990 | Dickie |
| 4,934,947 A | 6/1990 | Brummans et al. |
| 4,948,378 A | 8/1990 | Hoshino |
| 5,356,308 A | 10/1994 | Toba et al. |
| 5,433,632 A | 7/1995 | Cherney et al. |
| 5,513,065 A | 4/1996 | Caveney et al. |
| 5,542,853 A | 8/1996 | Bouchan |
| 5,562,472 A | 10/1996 | Dubois et al. |
| 5,674,093 A | 10/1997 | Vaden |
| 5,911,602 A | 6/1999 | Vaden |
| 5,941,734 A | 8/1999 | Ikeda et al. |
| 5,947,773 A | 9/1999 | Karam |
| 5,967,853 A | 10/1999 | Hashim |
| 6,056,568 A | 5/2000 | Arnett |
| 6,059,578 A | 5/2000 | Arnett |
| 6,065,985 A | 5/2000 | Marshall |
| 6,155,881 A | 12/2000 | Arnett et al. |
| 6,168,472 B1 | 1/2001 | Arnett |
| 6,176,742 B1 | 1/2001 | Arnett et al. |

(Continued)

FOREIGN PATENT DOCUMENTS

EP   1 018 789   7/2000

OTHER PUBLICATIONS

PCT International Search Report dated Jul. 7, 2009.

*Primary Examiner*—Neil Abrams
*Assistant Examiner*—Phuong Nguyen
(74) *Attorney, Agent, or Firm*—McCarter & English, LLP

(57) ABSTRACT

An insert device for use in a communication jack includes a housing, and plug interface contacts mounted with respect to the housing. At least one plug interface contact includes a first length extent extending along a first axial path and defining a first reaction surface that includes a first electrically conductive surface. The insert device includes a reactance unit having a reactance circuit operable to reduce or compensate for an electrical noise associated with signals conducted by the plug interface contacts, and a plurality of interconnection elements. At least one interconnection element defines a second reaction surface that includes a second electrically conductive surface. The insert device moves the reactance circuit relative to the plug interface contact by sliding the second reaction surface across the first reaction surface, and presses the second electrically conductive surface against the first electrically conductive surface.

42 Claims, 17 Drawing Sheets

U.S. PATENT DOCUMENTS

| | | |
|---|---|---|
| 6,186,834 B1 | 2/2001 | Arnett et al. |
| 6,244,908 B1 | 6/2001 | Hammond et al. |
| 6,346,010 B1 | 2/2002 | Emplit |
| 6,350,158 B1 | 2/2002 | Arnett et al. |
| 6,394,853 B1 | 5/2002 | Hammond et al. |
| 6,443,777 B1 | 9/2002 | McCurdy et al. |
| 6,464,541 B1 | 10/2002 | Hashim et al. |
| 6,547,597 B2 | 4/2003 | Harris, IV |
| 6,576,853 B2 | 6/2003 | Motojima |
| 6,612,876 B2 | 9/2003 | Hyland |
| 6,612,877 B2 | 9/2003 | Hyland |
| 6,641,443 B1 * | 11/2003 | Itano et al. .................. 439/676 |
| 6,663,436 B1 | 12/2003 | Arnett et al. |
| 6,758,698 B1 | 7/2004 | Caveney et al. |
| 6,780,035 B2 | 8/2004 | Bohbot |
| 6,786,776 B2 * | 9/2004 | Itano et al. .................. 439/676 |
| 6,869,318 B2 | 3/2005 | Viklund et al. |
| 6,975,960 B2 | 12/2005 | Kobayashi et al. |
| 7,074,092 B1 | 7/2006 | Green et al. |
| 7,153,168 B2 | 12/2006 | Caveney et al. |
| 7,166,000 B2 | 1/2007 | Pharney |
| 7,168,993 B2 | 1/2007 | Hashim |
| 7,179,131 B2 | 2/2007 | Caveney et al. |
| 7,241,181 B2 | 7/2007 | Machado et al. |
| 7,252,554 B2 * | 8/2007 | Caveney et al. ............. 439/676 |
| 7,281,957 B2 | 10/2007 | Caveney |
| 7,314,393 B2 | 1/2008 | Hashim |
| 7,341,493 B2 | 3/2008 | Pepe et al. |
| 7,367,851 B2 | 5/2008 | Machado et al. |
| 7,452,246 B2 * | 11/2008 | Caveney et al. ............. 439/676 |
| 2006/0014410 A1 | 1/2006 | Caveney |
| 2007/0254529 A1 | 11/2007 | Pepe et al. |
| 2007/0270044 A1 | 11/2007 | Belopolsky et al. |
| 2008/0045090 A1 | 2/2008 | Caveney |
| 2009/0029599 A1 * | 1/2009 | Jaouen et al. ............... 439/676 |

* cited by examiner (View Number 1 of 2: Upper Part)

(View Number 2 of 2: Lower Part)

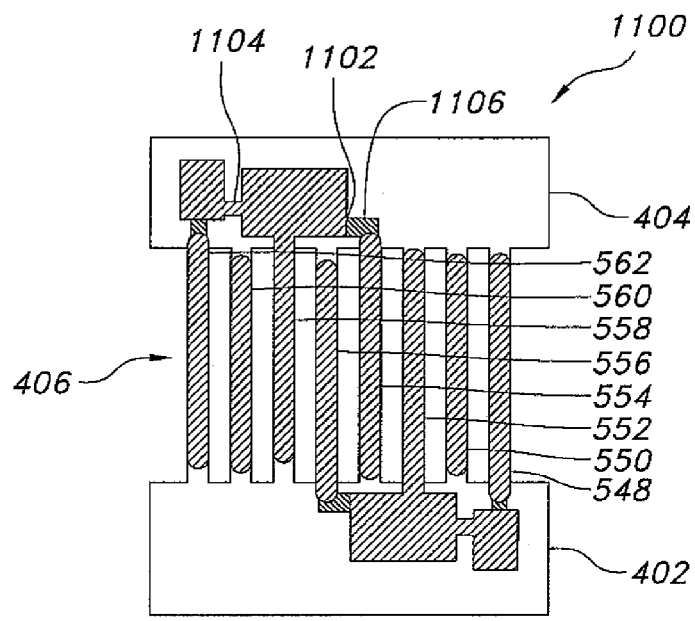
FIG. 11
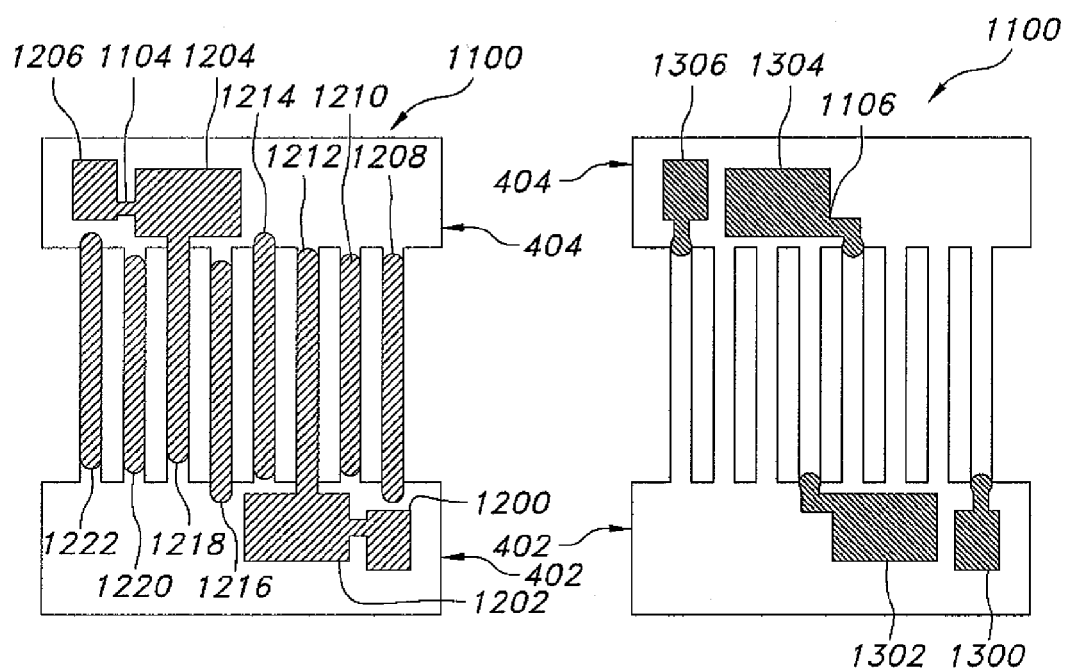
FIG. 12
FIG. 13

MODULAR INSERT AND JACK INCLUDING MOVEABLE REACTANCE SECTION

BACKGROUND

1. Technical Field

The present disclosure is directed to communications connectors and, more particularly, to connection systems equipped and configured to address and/or compensate for electrical noise or crosstalk (e.g., near-end crosstalk or NEXT).

2. Background Art

Devices for interfacing with high frequency data transfer media are generally known. Modular jack housing inserts have been developed that facilitate interface with connectors, i.e., plugs, that in turn interact with unshielded twisted pair (UTP) media. UTP media finds widespread application in structured cabling applications, e.g., in local area network (LAN) implementations and other in-building voice and data communications applications. In a UTP cable, a plurality of twisted copper pairs are twisted together and wrapped with a plastic coating. Individual wires generally have a diameter of 0.4-0.8 mm. Twisting of the wires increases the noise immunity and reduces the bit error rate (BER) associated with data transmission thereover. Also, using two wires rather than one to carry each signal permits differential signaling to be used, which offers enhanced immunity to the effects of external electrical noise.

As an alternative to UTP media, shielded twisted pair (STP) media is used in certain structured cabling applications. STP media includes shielding, e.g., a foil or braided metallic covering, that generally reduces the effects of outside interference. However, as compared to STP media, UTP media offers reduced cost, size and cable/connector installation time. In addition, the use of UTP media, as opposed to STP media, eliminates the possibility of ground loops (i.e., current flowing in the shield because the ground voltage at each end of the cable is not exactly the same, thereby potentially inducing interference into the cable that the shield was intended to protect). In short, UTP media is a flexible, low cost media having widespread application in voice and/or data communications.

The wide acceptance and use of UTP for data and voice transmission is also driven by the large installed base, low cost and ease of new installations. Another important feature of UTP is that it can be used for varied applications, such as for Ethernet, Token Ring, FDDI, ATM, EIA-232, ISDN, analog telephone (POTS), and other types of communication. This enables the same type of cable and system components (such as jacks, plugs, cross-patch panels and patch cables) to be used for an entire building installation, unlike STP media.

UTP media is being used for systems having increasingly higher data rates. In data transmission, the signal originally transmitted through the data transfer media is not necessarily the signal received. The received signal will consist of the original signal as modified by various distortions and additional unwanted signals introduced over the transmission path. Such distortions and unwanted signals affect the original signal between transmission and reception and are commonly collectively referred to as "electrical noise" or simply "noise." Noise can be a primary limiting factor in the performance of a communication system. Indeed, many problems may arise from the existence and/or introduction of noise during data transmission, such as data errors, system malfunctions and loss of the original signals (in whole or in part).

The transmission of data by itself causes unwanted noise. Electromagnetic energy, induced by the electrical energy in the individual signal carrying lines within the data transfer media and data transfer connecting devices, radiates onto adjacent lines in the same media or device. This cross coupling of electromagnetic energy (i.e., electromagnetic interference or EMI) from a "source" line to a "victim" line is called crosstalk. Most data transfer media consist of multiple pairs of lines bundled together. Communication systems typically incorporate many such media and connectors for data transfer. Thus, there exists an opportunity for significant crosstalk interference.

Electromagnetic energy waves can be derived by Maxwell's wave equations. These equations are basically defined using electric and magnetic fields. In unbounded free space, a sinusoidal disturbance propagates as a transverse electromagnetic wave. This means that the electric field vectors are perpendicular to the magnetic field vectors lying in a plane perpendicular to the direction of the wave. Crosstalk results in a waveform shaped differently than the one originally transmitted.

Crosstalk can be categorized in one of two forms. Near end crosstalk, commonly referred to as NEXT, arises from the effects of near field capacitive (electrostatic) and inductive (magnetic) coupling between source and victim electrical transmissions. NEXT increases the additive noise at the receiver and therefore degrades the signal to noise ratio (SNR). NEXT may be the most significant impediment to effective data transfer because the high-energy signal from an adjacent line can induce relatively significant crosstalk into the primary signal. A second form of crosstalk is far end crosstalk (FEXT) which arises due to capacitive and inductive coupling between the source and victim electrical devices at the far end or opposite end of the transmission path. FEXT is typically less of an issue because the far end interfering signal is attenuated as it traverses the loop.

Another major source of distortion for high speed signal transmission may be mismatch of transmission impedances. As the signal travels along transmission media, various interconnections are generally encountered. Each interconnection has its own internal impedance relative to the traveling signal. For UTP cabling, the transmission media impedance is generally 100 Ohms. Any offsets or differences in impedance values from connecting devices will produce signal reflections. Generally, signal reflections reduce the amount of transmitted signal energy to the receiver and/or distort the transmitted signal. Thus, signal reflections can lead to an undesirable increase data loss.

To accommodate higher frequency data communications, commercially available connection systems generally include compensation functionality that is intended to compensate for electrical noise, e.g., noise/crosstalk introduced in the connection assembly or assemblies. Since demands on networks using UTP systems (e.g., 100 Mbit/s, 1200 Mbit/s transmission rates and higher) have increased, it has become necessary to develop industry standards for higher system bandwidth performance. What began as simple analog telephone service and low speed network systems, has now become high speed data systems. As the speeds have increased, so has the noise.

The ANSI/TIA/EIA 568B standard defines electrical performance for systems that operate in the 1-250 MHz frequency bandwidth range. Exemplary data systems that utilize the 1-250 MHz frequency bandwidth ranges are IEEE Token Ring, Ethernet10Base-T and 100Base-T systems. Five performance categories have been defined by ANSI/TIA/EIA-568.2-10 and the subsequent ANSI/TIA/EIA-568B.2 promulgations, as shown in the Table 1 below. Compliance with these performance standards are used, inter alia, to identify cable/connector quality.

TABLE 1

| Category | Characteristic Specified up to Frequency (MHz) | Exemplary Uses |
| --- | --- | --- |
| 5 | 100 | TP-PMD, SONet, OC-3 (ATM), 100BASE-TX. |
| 5e | 100 | 10-100BASE-T. |
| 6 | 250 | 100-1000BASE-T. |
| 6A | 500 | 1000-10GBASE-T. |

UTP cable standards are also specified in the EIA/TIA-568 Commercial Building Telecommunications Wiring Standard, and such standards include electrical and physical requirements for UTP, STP, coaxial cables and optical fiber cables. For UTP, the requirements include (i) four individually twisted pairs per cable, (ii) each pair has a characteristic impedance of 100 Ohms +/-15% (when measured at frequencies of 1 to 100 MHz); and (iii) 24 gauge (0.5106-mm-diameter) or optionally 22 gauge (0.6438 mm diameter) copper conductors are specified. Additionally, the ANSI/TIA/EIA-568 standard specifies the color coding, cable diameter and other electrical characteristics, such as the maximum crosstalk (i.e., how much a signal in one pair interferes with the signal in another pair—through capacitive, inductive and other types of coupling).

The Category 5 cabling systems provided sufficient NEXT margins to allow for the high NEXT that occurs when using the present UTP system components. However, the demand for higher frequencies, more bandwidth and improved system performance (e.g., Ethernet 1000Base-T) for UTP cabling systems required enhanced system design/performance. More particularly, the TIA/EIA Category 6 standard extended performance requirements to frequency bandwidths of 1 to 250 MHz, requiring minimum NEXT values at 100 MHz to be −39.9 dB and −33.1 dB at 250 MHz for a channel link, and minimum NEXT values at 100 MHz to be −54 dB and 46 dB at 250 MHz for connecting hardware. The increased bandwidth accommodated by the Category 6 standard required increased focus on noise compensation.

More recently, the TIA/EIA 568 Category 6A or EIA568B.2-10 Augmented Category 6 cabling standard extends performance requirements to still higher frequencies, i.e., frequency bandwidths of 1 to 500 MHz. More particularly, the addendum specifies (i) minimum NEXT values at 100 MHz to be −39.9 dB and −26.1 dB at 500 MHz for a channel link, and (ii) minimum NEXT values at 100 MHz to be −54 dB and −34 dB at 500 MHz for connecting hardware. The requirements for Return Loss for a channel are −12 dB at 100 MHz and −6 dB at 500 MHz, and for a connector the corresponding requirements are −28 dB at 100 MHz and −14 dB at 500 MHz.

As noted above, a key element for compensation of NEXT and FEXT is the design and operation of the electrical interface, e.g., the electrical communication between jack and plug connectors. The standard modular jack housing is configured and dimensioned in compliance with the FCC part 68.500 standard which provides compatibility and matability between various media manufacturers. The standard FCC part 68.500 style for modular jack housing which does not add compensation methods/functionality to reduce crosstalk. This standard modular jack housing provides a straightforward approach/design and, by alignment of lead frames in a parallel, uniform pattern, high NEXT and FEXT are generally produced for certain adjacent wire pairs. More particularly, the standard FCC part 68.500 modular jack housing connector defines two lead frame section areas. Section one defines a matable area for electrical plug contact and section two is the output area of the modular jack housing. Section one aligns the lead frames in a parallel, uniform pattern from lead frame tip to the bend location that enters section two, thus producing relatively high NEXT and FEXT noises. Section two also aligns the lead frames in a parallel, uniform pattern from lead frame bend location to lead frame output, thus producing/allowing relatively high NEXT and FEXT noises.

There have been efforts aimed at reducing crosstalk through modified housing designs. For example, U.S. Pat. No. 7,281,957 to Caveney et al. discloses a communication connector with a flexible circuit board. The connector utilizes a flexible circuit board that is electrically and mechanically connected to the plug interface pins. The flexible circuit board makes electrical contact in two locations, one at the connectors plug interface pin section, and also at the insulation displacement contact IDC section. The flexible circuit board is used to transport the electrical signals from input plug/pin interface to IDC or visa versa. By design, this connector reduces noise but at the expense of excessive pin lengths that can increase or enhance unwanted noises. Another potential issue with respect to the connector of the Caveney '957 patent could be the insertion of an FCC regulated RJ11 plug insertion into the plug/pin interface. Because of the deep depression of force that is applied to the outer pins, potential damage could occur to the flexible circuit board, potentially rendering the connector virtually unusable. This method could be effective at reducing crosstalk, but potentially at a substantial cost (e.g., due to the usage and size of the flexible circuit board).

A similar approach to crosstalk reduction is disclosed in U.S. Pat. No. 7,309,261 Caveney et al. The Caveney '261 patent describes a communication connector that utilizes a flexible circuit board that makes electrical connection to the plug interface pins. In one instance, the electrical connections are physically and permanently connected to the plug interface pins by various welding methods. In another instance, the electrical connections are plug interface pins that make electrical connections to a rigid and stationary printed circuit board. Although the connector of the Caveney '261 patent has the potential to reduce crosstalk, the methods disclosed could potentially increase fabrication costs and introduce mechanical complication. Permanently attached printed circuit boards, whether flexible or rigid, have the potential to break electrical connection or produce open circuit data connections if a FCC part 47 out of specification plug Register Jack RJ45 is inserted. The usage of an electrical connection to a stationary printed circuit board further places the compensation at a distance that is further away from origination noise source, thus increasing the chances of allowing additional unwanted noise to be injected into adjacent pairs.

U.S. Pat. No. 6,139,371 to Troutman et al. discloses a communication connector assembly having a base support and first and second pairs of terminal contact wires with base portions mounted on the base support. The free end portions of the contact wires define a zone of contact within which electrical connections are established with a mating connector, and each pair of contact wires defines a different signal path in the connector assembly. The first and the second pair of contact wires have corresponding leading portions extending from the free end portions to a side of the zone of contact opposite from the base portions. A leading portion of a contact wire of the first pair and a leading portion of a contact wire of the second pair are constructed and arranged for capacitively coupling to one another, thus conveying capacitive crosstalk compensation to the zone of contact where offending crosstalk is introduced by a mated connector. The additional coupling of the connector assembly of the Troutman '371 patent may be inadequate in reducing crosstalk to a required degree because, inter alia, the elongated plates are crossed/overlapped and also adjacent, thus creating unwanted parallelisms between contacts 3 to 4 and contacts 5 to 6 and undesirably increasing crosstalk noises. Although crosstalk noise may be reduced by the design of the connector assembly of the Troutman '371 patent, the effective complex modes of coupling may be more than doubled, which potentially increases NEXT, FEXT and noise variation factors.

U.S. Pat. No. 6,176,742 to Arnett et al. discloses an electrical connector that provides capacitive crosstalk compensation coupling in a communication connector by the use of a capacitor compensation assembly. One or more crosstalk compensation capacitors are supported in the housing. Each compensation capacitor includes a first electrode having a first terminal, a second electrode having a second terminal, and a dielectric spacer disposed therebetween. The terminals of the electrodes are exposed at positions outside of the housing so that selected terminal contact wires of the connector make electrical contact with corresponding terminals of the compensation capacitors to provide capacitive coupling between the selected contact wires when the contact wires are engaged by a mating connector. Of note, a design of the type disclosed in the Arnett '742 patent can undesirably decrease contact flexibility, thereby adds complexity to design efforts. In addition, utilizing a curved spring beam contact design can increase unwanted NEXT/FEXT noises because of the adjacencies between pairs.

U.S. Pat. No. 6,443,777 to McCurdy et al. discloses a communication jack having a first and second pairs of contact wires defining corresponding signal paths in the jack. Parallel, co-planar free end portions of the wires are formed to connect electrically with a mating connector that introduces offending crosstalk to the signal paths. First free end portions of the first pair of contact wires are supported adjacent one another, and second free portions of the second pair are supported adjacent corresponding ones of the first free end portions. Intermediate sections of the first pair of contact wires diverge vertically and traverse one another to align adjacent to corresponding intermediate sections of the second pair of wires to produce inductive compensation coupling to counter the offending crosstalk from the plug. Capacitive compensation coupling may be obtained for the contact wires via one or more printed wiring boards supported on or in the jack housing.

Another method for crosstalk noise reduction and control in connecting hardware is addressed in commonly assigned U.S. Pat. No. 5,618,185 to Aekins. A connector for communications systems includes four input terminals and four output terminals in ordered arrays. A circuit electrically couples respective input and output terminals and cancels crosstalk induced across adjacent connector terminals. The circuit includes four conductive paths between the respective input and output terminals. Sections of two adjacent paths are in close proximity and cross each other between the input and output terminal. At least two of the paths have sets of adjacent vias connected in series between the input and output terminals. The subject matter of the Aekins '185 patent is hereby incorporated by reference.

Alternative conductor layouts for purposes of jack/plug combinations have been proposed. For example, U.S. Pat. No. 6,162,077 to Laes et al. and U.S. Pat. No. 6,193,533 to De Win et al. disclose male/female connector designs wherein shielded wire pairs are arranged with a plurality of side-by-side contacts and additional contact pairs positioned at respective corners of the male/female connector housings. The foregoing arrangement of contacts/contact pairs for shielded cables is embodied in an International Standard—IEC 60603-7-7—the contents of which are hereby incorporated herein by reference. The noted IEC standard applies to high speed communication applications with 8 position, pairs in metal foil (PIMF) shielded, free and fixed connectors, for data transmissions with frequencies up to 600 MHz.

Despite efforts to date, a need remains for connector designs that reliably and effectively address the potential for crosstalk noise, e.g., at higher transmission frequencies. In addition, a need remains for connector designs that compensate for crosstalk without adding undue complexity and/or potential cost to the connector design and/or manufacture. Moreover, a need remains for connector designs that accommodate and/or facilitate the introduction or non-introduction of compensation as may be desired based on variable factors encountered in use, e.g., different plug designs and/or plugs having differing contact layouts.

These and other needs are satisfied by the systems and connector designs disclosed herein, as will be apparent from the detailed description which follows, particularly when read in conjunction with the figures appended hereto.

SUMMARY

In accordance with embodiments of the present disclosure, an insert device for use in a communication jack is provided. The insert device includes a housing including walls defining an interior space, and a plurality of plug interface contacts mounted with respect to the housing, including wherein at least one plug interface contact of the plurality thereof includes a first length extent extending along a first axial path and defining a first reaction surface that includes a first electrically conductive surface. The insert device further includes a reactance unit. The reactance unit includes a reactance circuit at least partially disposed within the interior space of the housing and operable to at least one of reduce and compensate for an electrical noise associated with signals conducted by the plug interface contacts of the plurality thereof, the reactance circuit further including a plurality of interconnection elements, including wherein at least one interconnection element of the plurality thereof defines a second reaction surface that includes a second electrically conductive surface. The insert device is operable to move the reactance circuit relative to the at least one plug interface contact by sliding the second reaction surface across the first reaction surface along an axial direction corresponding to the first axial path, and the insert device operable to press the second electrically conductive surface against the first electrically conductive surface with a force sufficient to preserve direct electrical communication between the reactance circuit and the at least one plug interface contact.

The interior space of the housing may include a plurality of elongated channels, including wherein at least one elongated channel of the plurality thereof includes walls dimensioned and adapted to receive and guide a movement of a corresponding instance of the first length extent of the at least one plug interface contact, and/or including wherein at least one elongated channel of the plurality thereof includes walls dimensioned and adapted to receive and guide a movement of a corresponding instance of the at least one interconnection element of the reactance circuit.

The reactance circuit may be free floating with respect to the plug interface contacts of the plurality thereof. For example, the reactance circuit may be adapted to move relative to the plug interface contacts of the plurality thereof in at least one of the vertical direction, the axial horizontal direction, or both. The reactance circuit may be free floating with respect to the housing. For example, the reactance circuit may be adapted to move relative to the housing in at least one of the vertical direction, the axial horizontal direction, or both.

By sliding the second reaction surface across the first reaction surface along an axial direction corresponding to the first axial path, the insert device may operate to adjust an electrical distance along the first axial path between a point of contact of the reactance circuit with the at least one plug interface contact and a point of contact of the at least one plug interface with a corresponding instance of a jack interface blade of a mating communication plug. For example, the insert device may be operable to adjust the electrical distance along the first axial path at least to an extent of at least about 0.030 inches (e.g., to an extent falling in a range of between about 0.040 inches and 0.045 inches).

By sliding the second reaction surface across the first reaction surface along an axial direction corresponding to the first axial path, the insert device may operate to one of foreshorten the electrical distance along the first axial path, lengthen the electrical distance along the first axial path, or both.

The insert device may be operable to move the first and second electrically conductive surfaces between a first position relative to each other in which the function of the reactance circuit to at least one of reduce and compensate for the electrical noise is deactivated and a second position relative to each other in which the function of the reactance circuit to at least one of reduce and compensate for the electrical noise is activated. The insert device may be operable to move the first and second reaction surfaces between a first position relative to each other in which the first and second electrically conductive surfaces are electrically isolated to a second position relative to each other in which the first and second electrically conductive surfaces are in electrical communication with each other. The insert device may be operable to maintain the first and second reaction surfaces in direct physical communication with each other while moving the first and second reaction surfaces between a position relative to each other in which the first and second electrically conductive surfaces are physically isolated from each other, and a second position relative to each other in which the first and second reaction surfaces are in direct physical communication with each other. The insert device may be operable to move the first and second reaction surfaces between and among a first position relative to each other in which the first and second reaction surfaces are physically isolated from each other, a second position relative to each other in which the first and second reaction surfaces are in direct physical communication with each other but the first and second electrically conductive surfaces are electrically isolated from each other, and a third position relative to each other in which the first and second reaction surfaces are in electrical communication with each other.

The housing may includes an upper portion and a lower portion that cooperate to capture and support the plug interface contacts of the plurality thereof. The at least one plug interface contact includes eight (8) plug interface contacts in a side-by-side arrangement at least one end of the housing.

The reactance unit may include a flexible circuit board, wherein the reactance circuit includes capacitive elements formed via conductive layers of the flexible circuit board. For example, the capacitive elements include at least one of capacitive pad traces, capacitive plate traces, and capacitive interdigitated traces. The reactance unit may include a frame for supporting the reactance circuit relative to the at least one plug interface contacts, the frame incorporating at least one of a cantilever spring and a coil spring for so pressing the second electrically conductive surface against the first electrically conductive surface. The reactance unit may include a frame for supporting the reactance circuit relative to the at least one plug interface contacts, the frame including a base securely mounted with respect to the housing and a plurality of flexible support elements receiving cantilever-type support from the base and extending outward therefrom, each flexible support element being operable to support an individual one of the at least one interconnection element. For example, each flexible support element may terminate in a rounded distal tip, and wherein each individual one of the at least one interconnection element is form bent to conform to a shape of the rounded distal tip of the corresponding flexible support element.

The insert device may be operable to move the reactance circuit relative to the at least one plug interface contact at least in part by causing the reactance circuit to rotate one of clockwise and counterclockwise in response to the at least one plug interface contact is rotating the other of clockwise and counterclockwise. The insert device may be operable to move the reactance circuit relative to the at least one plug interface contact at least in part by causing the reactance circuit to translate vertically upward in response to the at least one plug interface contact translating vertically downward. The insert device may be operable to move the reactance circuit relative to the at least one plug interface contact at least in part by causing the reactance circuit to rotate vertically upwardly and rearward in response to the at least one plug interface contact rotating vertically downward.

In accordance with embodiments of the present disclosure, a jack assembly is provided. The jack assembly includes a jack housing defining a plug-receiving space, and an insert device positioned within the jack housing, the insert device including an insert housing, and a plurality of plug interface contacts mounted with respect to the insert housing, including wherein at least one plug interface contact of the plurality thereof includes a first length extent extending along a first axial path and defining a first reaction surface that includes a first electrically conductive surface. The insert device further includes a reactance unit including a reactance circuit at least partially disposed within the interior space of the housing and operable to at least one of reduce and compensate for an electrical noise associated with signals conducted by the plug interface contacts of the plurality thereof, the reactance circuit further including a plurality of interconnection elements, including wherein at least one interconnection element of the plurality thereof defines a second reaction surface that includes a second electrically conductive surface. In response to a mating plug being received in the plug receiving space of the jack housing, the insert device is operable to move the reactance circuit relative to the at least one plug interface contact by sliding the second reaction surface across the first reaction surface along an axial direction corresponding to the first axial path, and to press the second electrically conductive surface against the first electrically conductive surface with a force sufficient to preserve direct electrical communication between the reactance circuit and the at least one plug interface contact.

In the jack assembly, the reactance circuit may be free floating with respect to the plug interface contacts of the plurality thereof. For example, the reactance circuit may be adapted to move relative to the plug interface contacts of the plurality thereof in at least one of the vertical direction, the axial horizontal direction, or both. The reactance circuit may be free floating with respect to the insert housing. For example, the reactance circuit may be adapted to move relative to the housing in at least one of the vertical direction, the axial horizontal direction, or both.

In the jack assembly, in response to a mating plug being received in the plug receiving space of the jack housing, the insert device may be operable to adjust an electrical distance along the first axial path between a point of contact of the reactance circuit with the at least one plug interface contact and a point of contact of the at least one plug interface with a corresponding instance of a jack interface blade of a mating communication plug. For example, the insert device may be operable to adjust the electrical distance along the first axial path at least to an extent of at least about 0.030 inches (e.g., to an extent falling in a range of between about 0.040 inches and 0.045 inches). By sliding the second reaction surface across the first reaction surface along an axial direction corresponding to the first axial path, the insert device may operate to one of foreshorten the electrical distance along the first axial path, lengthen the electrical distance along the first axial path, or both.

In the jack assembly, in response to a mating plug being received in the plug receiving space of the jack housing, the insert device may be operable to move the first and second electrically conductive surfaces between a first position relative to each other in which the function of the reactance circuit to at least one of reduce and compensate for the electrical noise is deactivated and a second position relative to each other in which the function of the reactance circuit to at least one of reduce and compensate for the electrical noise is activated. In response to a mating plug being received in the plug receiving space of the jack housing, the insert device may be operable to move the first and second reaction surfaces between a first position relative to each other in which the first and second electrically conductive surfaces are electrically isolated to a second position relative to each other in which the first and second electrically conductive surfaces are in electrical communication with each other.

In the jack assembly, the insert device may be operable to maintain the first and second reaction surfaces in direct physical communication with each other while moving the first and second reaction surfaces between a position relative to each other in which the first and second electrically conductive surfaces are physically isolated from each other, and a second position relative to each other in which the first and second reaction surfaces are in direct physical communication with each other. The insert device may be operable to move the first and second reaction surfaces between and among a first position relative to each other in which the first and second reaction surfaces are physically isolated from each other, a second position relative to each other in which the first and second reaction surfaces are in direct physical communication with each other but the first and second electrically conductive surfaces are electrically isolated from each other, and a third position relative to each other in which the first and second reaction surfaces are in electrical communication with each other.

In the jack assembly, the reactance unit may include a flexible circuit board, wherein the reactance circuit includes capacitive elements formed via conductive layers of the flexible circuit board.

In the jack assembly, the insert device may be operable to move the reactance circuit relative to the at least one plug interface contact at least in part by causing the reactance circuit to rotate one of clockwise and counterclockwise in response to the at least one plug interface contact is rotating the other of clockwise and counterclockwise. 40. In response to a mating plug being received in the plug receiving space of the jack housing, the insert device may be operable to move the reactance circuit relative to the at least one plug interface contact at least in part by causing the reactance circuit to translate vertically upward in response to the at least one plug interface contact translating vertically downward.

In the jack assembly, in response to a mating plug being received in the plug receiving space of the jack housing, the insert device may be operable to move the reactance circuit relative to the at least one plug interface contact at least in part by causing the reactance circuit to rotate vertically upwardly and rearward in response to the at least one plug interface contact rotating vertically downward.

These and other unique features of the disclosed systems, apparatus and methods will become more readily apparent from the following description, particularly when read in conjunction with the appended figures.

BRIEF DESCRIPTION OF THE DRAWINGS

So that those having ordinary skill in the art to which the subject disclosure appertains will more readily understand how to construct and employ the systems, apparatus and methods of the subject disclosure, reference may be had to the drawings wherein:

FIG. 11 is a schematic top plan view of a second variation of the reactance circuit embodied by the flexible PCB of FIGS. 4 and 5, including at least partial depictions of certain of the conductive layers thereof;

FIG. 12 is a schematic plan view of one of the conductive layers of the reactance circuit of FIG. 11;

FIG. 13 is a schematic plan view of another one of the conductive layers of the reactance circuit of FIG. 11;

each of FIGS. 18, 19, 20, and 21 is a respective cross-sectional side view of the insert device of FIG. 1 corresponding to the section line 18-18 appearing in FIG. 17, including wherein FIGS. 18-21 collectively and sequentially depict an interaction between the insert device of FIG. 1 and the plurality of conventional blade-type electrical contacts of FIG. 17 in accordance with embodiments of the present disclosure, and wherein the final view of the sequence, i.e., FIG. 21 specifically corresponds to FIG. 17 (e.g., at least partially depicts an assembled connection system)

DESCRIPTION OF EXEMPLARY EMBODIMENT(S)

Figure 1:
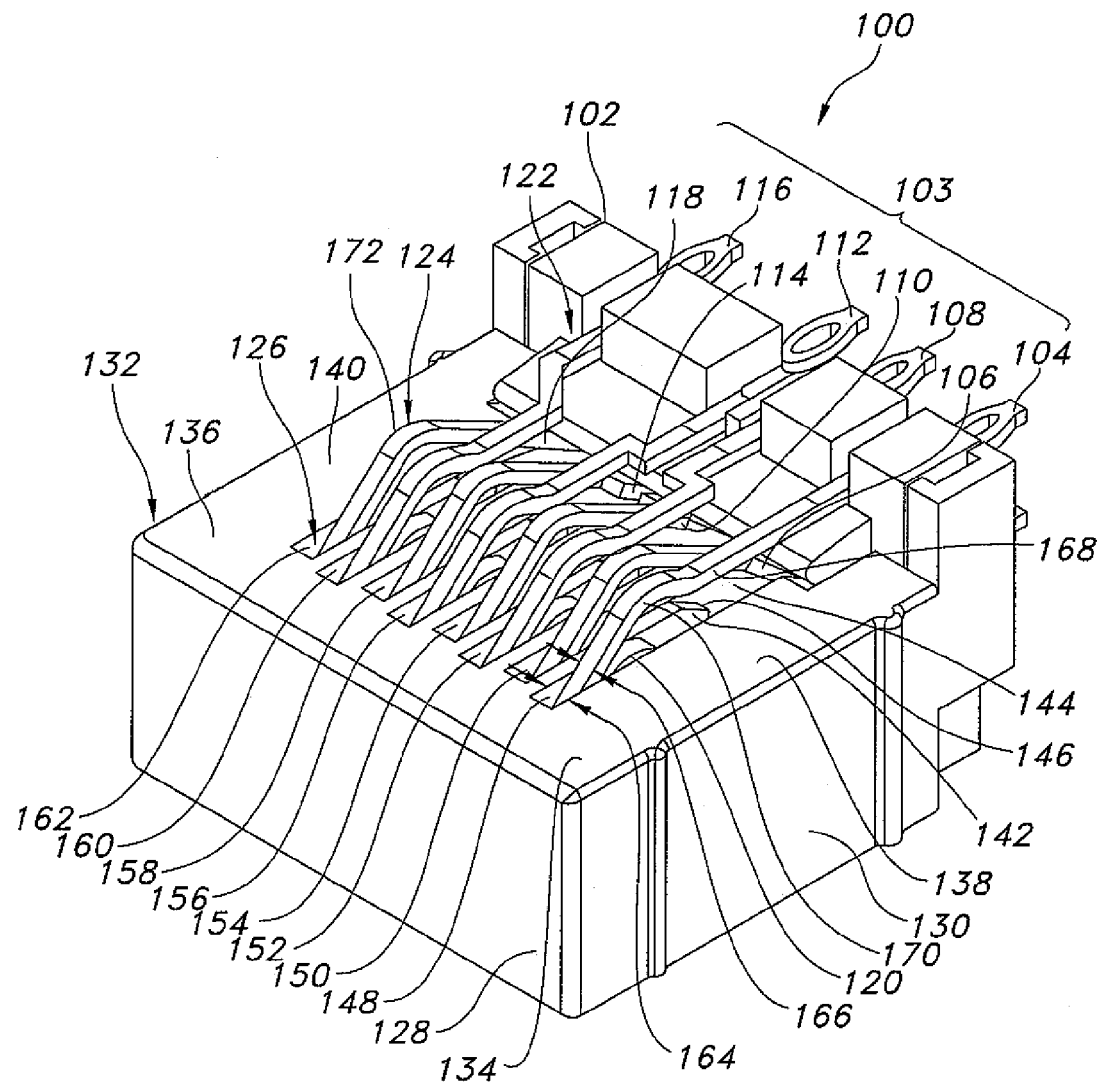
FIG. 1 is a perspective view of an exemplary insert device in accordance with embodiments of the present disclosure, wherein components of the insert device include a housing, an arrangement of elongated contact pins, and a reactance unit.

In accordance with embodiments of the present disclosure, advantageous modular insert assemblies are provided for use in voice/data communication systems, jack assemblies are provided that include such insert assemblies, and jack/plug combinations are provided that benefit from the advantageous structures, features and functions disclosed herein. The present disclosure provides methods for effecting voice/data communications wherein modular insert assemblies, jacks containing the disclosed insert assemblies and/or jack/plug combinations as described herein, are advantageously employed.

In accordance with embodiments of the present disclosure, modular insert assemblies are provided that include a secondary feature of noise compensation that allows interrupted communications across individual contacts, e.g., based upon interaction with corresponding plug contacts. Such modular insert assemblies may, for example, be incorporated in a telecommunications connector system that is designed to reduced electro-magnetic interference (EMI) from internal adjacent transmission lines.

In accordance with embodiments of the present disclosure, a moveable reactance unit is provided as part of a corresponding jack, wherein the reactance unit is activated or initiated by the insertion of a modular plug into the jack, based upon interaction with corresponding contacts of the modular plug. For example, the reduction of EMI may be optional and/or may be performed via non-conventional methods or techniques of connecting hardware.

In accordance with embodiments of the present disclosure, internal contacts of a lead frame assembly are initially isolated from corresponding noise-reduction circuitry, wherein when the internal contacts are mechanically activated, the noise-reduction circuitry moves upward (e.g., slides into position) toward the origination noise source. For example, the final position of the noise-reduction circuitry relative to the noise source may be dependent on a final (e.g., fully mated) position of an inserted plug/blade assembly, and/or of the contact blades associated with such assembly.

In accordance with embodiments of the present disclosure, a reactance unit is provided that includes a flexible printed circuit board (PCB) supported by a resilient frame. The flexible PCB may embody a reactance circuitry, and the resilient frame may be constructed of plastic and/or of a metalized material. The resilient frame may include a plurality of individual fingers, each of which supports an corresponding individual one of a plurality of elongated contact members associated with the flexible PCB. The flexible PCB may be a free floating and/or mobile PCB that is not necessarily permanently attached to any devices and/or to adjacent components of the reactance unit, an insert device of which the reactance unit forms a part, or the jack connector within which the insert device is incorporated. The resilient frame may be designed to provide a motional structure that is activated by the insertion of a modular plug into the jack connector, wherein as the contact blades of the modular plug are inserted into a corresponding housing of the jack connector containing the insert device, the contact blades impinge upon corresponding contacts of the insert device, which contacts in turn impinge upon the elongated contact members of the flexible PCB, which elongated contact members in turn impinge upon the fingers of the resilient frame, causing the resilient frame and the flexible PCB to move in unison relative to the corresponding contacts of the insert device.

In accordance with embodiments of the present invention, a reactance unit, when combined with the contacts of an insert device, may feature desired geometries, e.g., through bending or the like, so as to reduce noise and rebalance the signal pairs in a simple and low cost manner, and without altering the impedance characteristics of the wire pairs. The design of the reactance unit may be such as to provide reliable functionality over an extended period by, inter alia, reducing the potential for wire pair deformation, e.g., in a standard EIA T568B style configuration. Each of the contact pins of the insert device may advantageously define elongated cantilevered members that are supported by the insert and/or by a corresponding jack housing. Deflection of the cantilevered members may be effective to complete a circuit associated with activation of the reactance unit, e.g., through engagement with corresponding contact blades of a mating plugs.

In accordance with embodiments of the present invention, the contacts of the insert device may take the form of lead frames, although the present disclosure is not limited to lead frame implementations. In at least some exemplary embodiments wherein the contacts of the insert device are fabricated as lead frames, such lead frames may be positioned in a corresponding housing for subsequent positioning in a jack housing. Once assembled in a jack housing, the contacts of the insert device may facilitate electrical interface and communication with contacts in a connecting assembly, e.g., a plug. The insert device may be used in a modular jack that is adapted and to receive and compensate signals transmitted through the eight leads from plugs of differing design/layout. Thus, the disclosed insert/jack may be adapted to receive and compensate signals from a standard RJ45 plug. The insert device may also be advantageously adapted to receive and compensate signals from a plug that is configured according to the IEC 60603-7-7 standard (see, e.g., U.S. Pat. Nos. 6,162, 077 and 6,193,533).

Referring now to the drawings, FIG. 1 illustrates an insert device 100 in accordance with embodiments of the present disclosure. The insert device 100 includes a housing 102, an arrangement 103 of elongated contact pins 104, 106, 108, 110, 112, 114, 116, and 118 mounted with respect to the housing 102, and a reactance unit 120 mounted with respect to the housing 102. In accordance with embodiments of the present disclosure, including but not limited to the insert device 100 depicted in FIG. 1, the reactance unit 120 and the arrangement 103 of elongated contact pins are configured and adapted to permit the same to be selectively caused to reciprocate relative to each other (e.g., including but not limited to circumstances in which corresponding facing surfaces of the same are allowed to slide against and/or relative to each other). As will be described in greater detail below, the reactance unit 120 and the arrangement 103 of elongated contact pins may be capable of selectively reciprocating relative to each other at least between a first relative position effective to render active, and a second relative position effective to render inactive, a noise reduction or noise compensation feature/function of the reactance unit 120 with respect to signals carried by and/or passing within at least one or more of the elongated contact pins of the arrangement 103.

The above-described first relative position may, for example, be associated with an instance of intimate physical contact between corresponding facing surfaces (obscured) of the reactance unit 120 and the at least one or more of the elongated contact pins of the arrangement 103, e.g., wherein such intimate physical contact is effective (e.g., of sufficient extent in terms of area overlap and/or physical pressure) to produce, maintain, support or achieve intimate electrical communication between the reactance unit 120 and the at least one or more of the elongated contact pins of the arrangement 103, such that a reactance circuit (shown and discussed in greater detail below) associated with the reactance unit 120 is active (and/or is activated). In accordance with embodiments of the present disclosure, the second relative position may be associated with a corresponding instance of a spatial gap between the corresponding facing surfaces (obscured), e.g., such that the above-described instance of intimate physical contact is substantially destroyed or eliminated, and the reactance unit 120 is inactive (and/or is deactivated), e.g., for lack of the necessary electrical communication between the reactance 120 and the at least one or more of the elongated contact pins of the arrangement 103. In accordance with other embodiments of the present disclosure, the second relative position may both include intimate physical contact between corresponding facing surfaces of the reactance unit 120 and the at least one or more of the elongated contact pins of the arrangement 103, and at the same time, still lack the necessary electrical communication (e.g., direct or otherwise) between the reactance unit 120 and the at least one or more of the elongated contact pins of the arrangement 103. In such circumstances, wherein the reactance unit 120 and the at least one or more of the elongated contact pins of the arrangement 103 are substantially electrically isolated from each other, the reactance unit 120 is, similarly, inactive (and/or is deactivated).

In accordance with embodiments of the present disclosure, including but not limited to the example of the insert device 100 depicted in FIG. 1, the reactance unit 120 may be sized, shaped, dimensioned and/or configured to reciprocate both with respect to the housing 102 and with respect to at least one or more of the elongated contact pins of the arrangement 103, including wherein the reactance unit is adapted to be selectively activated via the establishment of a noise-reducing or noise-compensating instance of intimate physical contact between corresponding electrically conductive facing surfaces of the reactance unit 120 and the at least one or more elongated contact pins of the arrangement 103, and wherein such noise-defeating or noise-compensating instance of intimate physical contact is further selectively defeatable in accordance with at least one normal mode of operation of the insert device 100.

As used herein, and particularly as used herein in reference to the insert device 100, the term "normal mode of operation" may be considered to include, for example, a mode of operation of a particular device that is repeatable, at least insofar as it does not necessarily tend to detract in any structurally or functionally significant way from a characteristic useful life of the device that comprehends or predicts multiple successful instances of the use of such mode of operation over the course of time.

As used herein, and particularly as used herein in reference to the insert device 100, the term "normal mode of operation" may be considered to include, for example, a mode of operation of a particular device that, when undertaken for a first time or for a single time with respect to the particular device, does not necessarily require any structurally or functionally significant portion or region of a particular material of which the device is at least partially composed, or from which the device is at least partially formed, to undergo plastic deformation, to develop life-shortening cracks, or to become physically broken. As used herein, and particularly as used herein with reference to the insert device 100, the term "particular material" may be considered to include, for example, a separately cognizable material, such as an elemental and/or substantially homogenous material (e.g., a pure metal, such as steel, pure copper, pure nickel, etc., or a metal alloy, such as a steel-based or aluminum-based alloy), and/or a mixture or amalgamation of a plurality of separately cognizable materials (e.g., an eutectic solder, such as a lead solder or a lead-free solder). As used herein, and particularly as used herein with reference to a particular material or materials of which the insert device 100 is composed, or from which the insert device 100 is formed, the term "life-shortening cracks" may be considered to refer, for example, to cracks in such material which, by virtue of their particular location, size, and/or orientation, are characteristically subject to relatively rapid propagation through such material or materials. As used herein, and particularly as used herein with reference to a particular material or materials of which the insert device 100 is composed, or from which the insert device 100 is formed, the term "physically broken" may be considered to refer, for example, to circumstances in which such material or materials undergo a catastrophic material fracture, and/or separate into two or more pieces from what was previously a unitary or elemental construction.

As used herein, the term "normal mode of operation" may be considered to exclude, for example, a mode of operation of a particular device that includes a reactance circuit and a corresponding arrangement of lead frames, and that, when undertaken for a first time or for a single time with respect to the particular device, breaks or destroys any permanent and/or fixed mounting arrangements (e.g., solder joints) between the reactance circuit and one or more of the lead frames of the corresponding arrangement. By contrast, and particularly as used herein, the term "normal mode of operation" may be considered to include, for example, modes of operation of the insert device 100 in which the reactance unit 120 is reciprocated, rotated, and/or translated with respect to the elongated contact elements of the arrangement 103, including wherein corresponding facing surfaces (e.g., electrically conductive or otherwise) thereof are moved into or out of intimate physical contact with each other, and/or are caused to slide against each other, as described in greater detail below.

As shown in FIG. 1, a respective overall axial length extent of each of the elongated contact pins 104, 106, 108, 110, 112, 114, 116, and 118 may be considered to include adjacent respective proximal, intermediate, and distal extents 122, 124, and 126. At least in a vicinity of the respective proximal extents 122 of the elongated contact pins 104, 106, 108, 110, 112, 114, 116, and 118, the latter may be securely attached or affixed to the housing 102. At least in a vicinity of the respective intermediate and/or distal extents 124, 126 of the elongated contact pins 104, 106, 108, 110, 112, 114, 116, and 118, the latter may include downward facing surfaces (obscured) capable of maintaining, achieving, and/or being placed in intimate physical contact with corresponding upward-facing surfaces (obscured) of the reactance unit 120.

In accordance with embodiments of the present disclosure, the insert device 100 may exhibit an initial or "at rest" configuration in which at least one or more of the elongated contact pins of the arrangement 103 (e.g., at least two thereof) are in intimate physical contact with the reactance unit 120, such that an externally-applied force is not strictly necessary to bring about or maintain such contact. Further in accordance with embodiments of the present disclosure, the insert device 100 may exhibit an initial or "at rest" configuration in which at least one or more of the elongated contact pins of the arrangement 103 (e.g., at least two thereof) are spaced apart with respect to the reactance unit 120, such that an externally-applied force may be necessary to bring about and/or maintain intimate physical contact between such initially spaced apart elongated contact pins of the arrangement 103 and the reactance unit 120. As shown in FIG. 1, in which the insert device 100 exhibits such an "at rest" configuration, four of the elongated contact pins of the arrangement 103 (namely elongated contact pins 106, 110, 114, and 118) are in intimate physical contact with the reactance unit 120, and the four remaining elongated contact pins of the arrangement 103 (namely elongated contact pins 104, 108, 112, 116) are spaced apart with respect to the reactance unit 120. Other (e.g., alternative) arrangements are possible for "at rest" configurations for insert devices in accordance with the present disclosure. For example, arrangements are possible in which each and every one of the elongated contact pins of the arrangement 103 is in intimate physical contact with the reactance unit 120 when the insert device 100 is "at rest" (not shown). For another example, arrangements are possible in which exactly none of the elongated contact pins of the arrangement 103 are in intimate physical contact with the reactance unit 120 when the insert device 100 is "at rest" (e.g., wherein each such contact is spaced apart with respect to the reactance unit 120) (not shown).

The housing 102 may be fabricated from any suitable material, including but not limited to a Nylon material, and/or a low dielectric material, such as a plastic material. The housing 102 may include or define walls, including but not limited to respective front, side, and upper walls 128, 130, 132, 134, wherein the walls of the housing 102 define an interior cavity (obscured) within which the reactance unit 120 may be disposed, and/or within which the reactance unit 120 may be mounted with respect to the housing 102. The upper wall 134 of the housing 102 may include a forward region 136 disposed in front of the arrangement 103 of elongated contact pins 104, 106, 108, 110, 112, 114, 116, and 118, and respective lateral regions 138, 140 disposed on opposite respective sides thereof. The housing 102 may further define a series of slender, vertically-oriented, and/or internally disposed channel walls 142, wherein each of the channel walls 142 may extend (e.g., in the manner of a cantilever-type interface) rearwardly from the front wall 128, and/or downwardly from the upper wall 134. The housing 102 may further define a reaction surface 144, and each of the channel walls 142 may extend rearwardly to a vicinity of the reaction surface 144, at which vicinity the channel walls 142 may terminate in respective distal ends 146. The structure and function of the channel walls 142 will be discussed in greater detail below.

Still referring to FIG. 1, each of the forward region 136, the lateral regions 138, 140, and the channel walls 142 may collectively define an arrangement of elongated channels 148, 150, 152, 154, 156, 158, 160, and 162 corresponding to the arrangement 103 of elongated contact pins 104, 106, 108, 110, 112, 114, 116, and 118. Each elongated channel 148, 150, 152, 154, 156, 158, 160, and 162 may include a corresponding gap formed in the upper wall and defining a width dimension 164 wide enough in comparison to a corresponding dimension 166 of the elongated contact pins 104, 106, 108, 110, 112, 114, 116, and 118 permitting each such channel 148, 150, 152, 154, 156, 158, 160, and 162 to accommodate a corresponding elongated contact pin of the plurality 103 within the housing 102, and/or serve as a channel guide for limiting lateral movement thereof relative to the housing 102. In accordance with embodiments of the present disclosure, the channels 148, 150, 152, 154, 156, 158, 160, and 162 may further serve as access apertures through which corresponding extents of the elongated contact pins 104, 106, 108, 110, 112, 114, 116, and 118 are permitted to extend or descend into the housing 102.

Still referring to FIG. 1, the elongated contact pins 104, 106, 108, 110, 112, 114, 116, and 118 may comprise respective lead frames defining a substantially flat (e.g., rectangular) shape in terms of their cross-sectional geometry, and may define at least two different types of axial geometries in terms of vertical bends formed along their respective lengths. For example, a first or "upper" plurality of the elongated contact pins sharing a first such axial geometry may include elongated contact pins 104, 108, 112 and 116, and a second or "lower" plurality of the elongated contact pins sharing a second such axial geometry may include elongated contact pins 106, 110, 114, 118. With respect to the elongated contact pins 104, 108, 112, and 116 of the upper plurality, their respective proximal extents 122 may extend substantially solely in the horizontal direction, and their respective intermediate extents 124 may incorporate an upward bend 168 and a main downward bend 170. With respect to the elongated contact pins 106, 110, 114, and 118 of the lower plurality, their respective proximal extents 122 may extend not only horizontally, but also vertically upward from the housing 102 (e.g., on a slant), and their respective intermediate extents 124 may incorporate a main downward bend 172 (e.g., without any other additional bends of similar or comparable size, and/or without any adjacent and/or nearby upward bend). Other geometries are possible.

Figure 2:
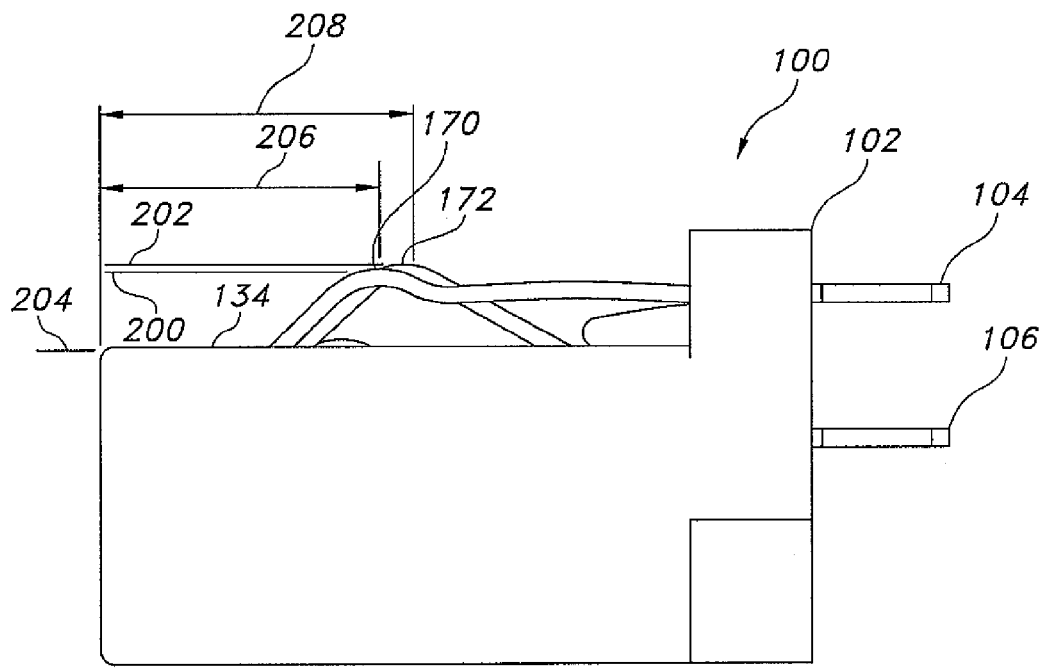
FIG. 2 is a side elevational view of the insert device of FIG. 1.

Turning now to the FIG. 2 side view of the insert device 100 and the elongated contact pins 104 and 106 thereof, the elongated contact pins of the upper plurality (e.g., including elongated contact pin 104) may be substantially aligned with each other in terms of their respective side-facing profiles. In like fashion, the elongated contact pins of the lower plurality (e.g., including elongated contact pin 106) may be substantially aligned with each other in terms of their respective side-facing profiles. The main downward bends 170 of the elongated contact pins of the upper plurality may occupy a position corresponding to a first elevation 200, the main downward bends 172 of the elongated contact pins of the lower plurality may occupy a position corresponding to a second elevation 202, and the upper wall 134 of the housing 102 may occupy a position corresponding to a third elevation 204. In accordance with embodiments of the present disclosure, each of the first and second elevations 200, 202 may be higher than the third elevation 204, permitting each of the elongate contact pins 104, 106, 108, 110, 112, 116, 118 and 120 to achieve intimate physical contact with and/or to establish direct electrical communication with corresponding contacts of another (e.g., mating) connector, as will be described in greater detail below. In accordance with embodiments of the present disclosure, one of the first and second elevations 200, 202 may be higher than or above the other (e.g., the second elevation 202 may be higher than or above the first elevation 200 (as shown in FIG. 2), or vice versa). In accordance with embodiments of the present disclosure, the main downward bends 170 of the elongated contact pins of the upper plurality may occupy a position corresponding to a first distance 206 from an axial position of the front wall 128 of the housing 102, and the main downward bends 172 of the elongated contact pins of the lower plurality may occupy a position corresponding to a second distance 208 from the same datum, wherein the first and second distances 206, 208 may be different than each other (e.g., the first distance 206 may be smaller than the second distance 208).

Figure 3:
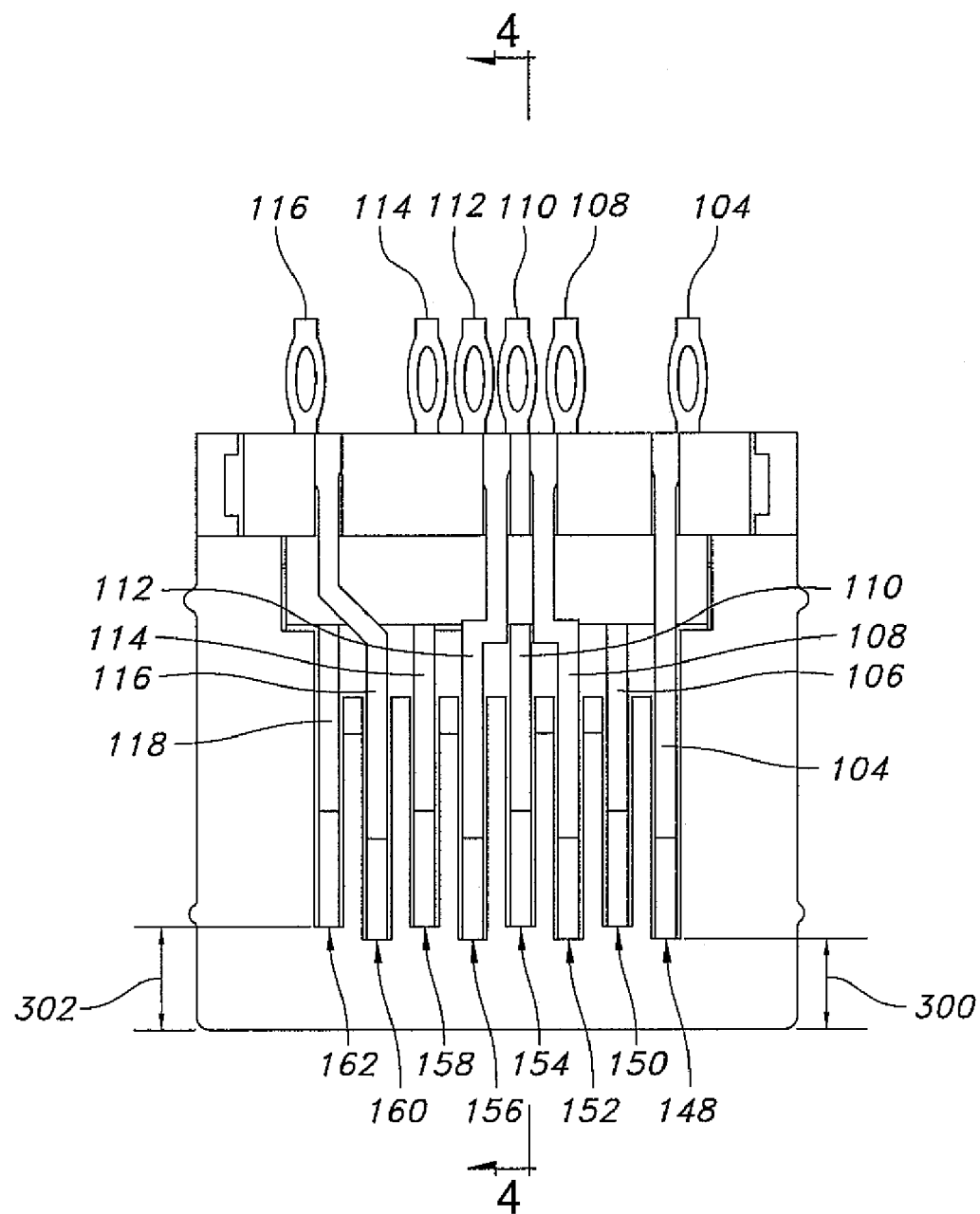
FIG. 3 is a top plan view of the insert device of FIG. 1.

Similarly, and as best shown in FIG. 3, the elongated channels 148, 152, 156 and 160 associated with the elongated contact pins 104, 108, 112, and 116 of the upper plurality may extend to a position corresponding to a first distance 300 from the axial position of the front wall 128, the elongated channels 150, 154, 158 and 162 associated with the elongated contact pins 106, 110, 114 and 118 of the lower plurality may extend to a position corresponding to a second distance 302 from the axial position of the front wall 128, and the first and second distances 300 and 302 may be different than each other (e.g., the first distance 300 may be shorter than the second distance 302), such that as a whole, the elongated channels 148, 150, 152, 154, 156, 158, 160, and 162 may present a staggered appearance when shown in top plan view.

Figure 4:
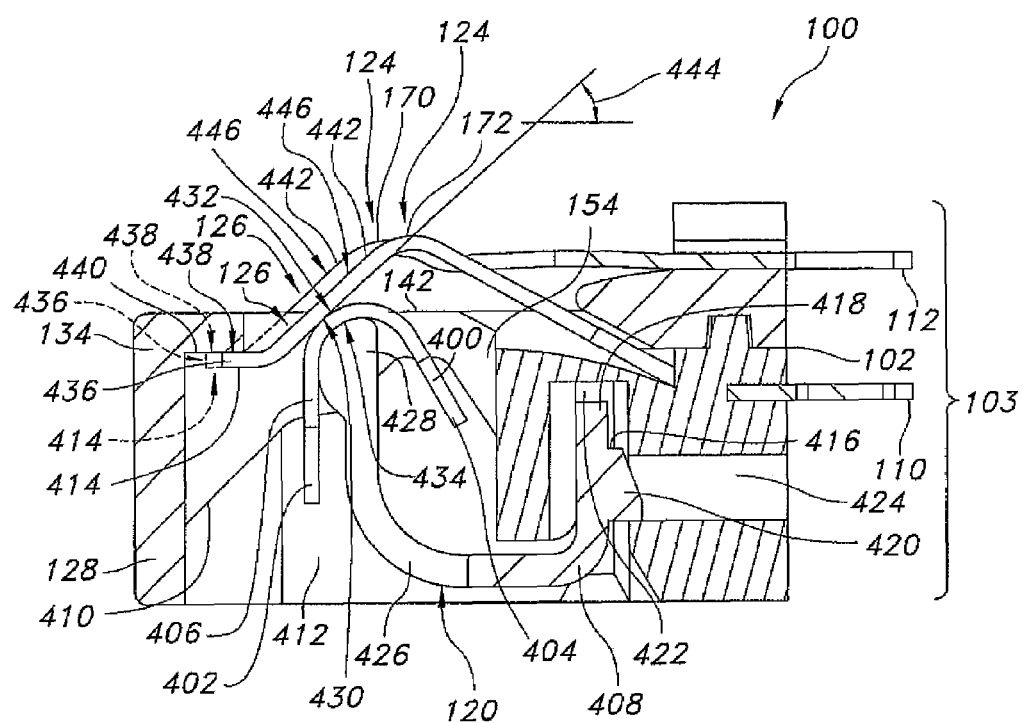
FIG. 4 is a cross-sectional side view of the insert device of FIG. 1 corresponding to the section line 4-4 appearing in FIG. 3, wherein the housing of the insert device is shown to define a cavity at least partially containing the elongated contact pins, and within which is mounted the reactance unit, which is shown to include a reactance circuit embodied by a flexible printed circuit board (PCB) and a frame for supporting the flexible PCB.

Turning now to FIG. 4, in accordance with embodiments of the present disclosure, the reactance unit 120 may include a reactance circuit embodied by a flexible printed circuit board (PCB) 400. The flexible PCB 400 may include a first end section 402, a second end section 404 opposite the first end section 402, and an intermediate section 406 disposed between the first and second end sections 402, 404. The reactance unit 120 may further include a frame 408 mountable to the housing 102 and sized, shaped, dimensioned and configured to support the flexible PCB 400 within the housing 102, and/or to advantageously position the flexible PCB 400 with respect to other components of the insert device 100, including, but not necessarily limited to, with respect to each of the elongate contact pins 110 and 112 shown in FIG. 4, as well as with respect to each of the other elongate contact pins 104, 106, 108, 114, 116, and 118 (FIG. 1) of the insert device 100.

Still referring to FIG. 4, walls of the housing 102, including but not limited to the front wall 128, the upper wall 134, and at least respective undersides 410 of the channel walls 142, may collectively define a cavity 412 within the housing 102. At least a portion of the reactance unit 120 may occupy the cavity 412, including but not limited to the first and second end sections 402, 404 of the flexible PCB 400 (e.g., as supported therein by the frame 408 and the intermediate section 406 of the flexible PCB 400). The first and second end sections 402, 404 may function as circuitry locators (as shown and discussed below). The first and second end sections 402, 404 may substantially solely occupy the cavity 412 beneath the elongated channels 148, 150, 152, 154, 156, 158, 160, and 162 (FIG. 1), and as such may function as stabilizers with respect to movement of the flexible PCB 400 within and/or with respect to the housing, including but not limited to preventing upward escape of the PCB 400 from the housing 102, and limiting an extent of laterally-directed motion (e.g., into or out of the paper of FIG. 4).

The respective distal extents 126 of each of the elongated contact pins of the arrangement 103 may include respective free end portions 414. The free end portions 414 may extend into the housing 102 and/or beneath the upper wall 134.

The frame 408 may include a proximal section 416 adapted to facilitate forming a secure (e.g., cantilever-style) mounting arrangement for the frame 408 with respect to the housing 102. For example, the proximal section 416 of the frame 408 may include respective vertically- and horizontally-extending mounting features 418, 420 adapted to cooperate with corresponding receiving structures 422, 424 of the housing 102 to ensure that the frame 408 is securely affixed relative to the other structures and components of the insert device 100.

The frame 408 may further include a distal section 426 extending forward and upward within the cavity 410 and including a distal end 428 sized, shaped, dimensioned and configured to support the flexible PCB 400 in a manner consistent with the noise reduction function of the reactance circuit embodied therein. For example, at least the distal section 426 of the frame 408 may be fabricated from a resilient material, including but not limited to a resilient metal or plastic material, and at least a portion of the distal section 426 of the frame 408 may extend upward between adjacent instances of the channel wall 142 and at least partially into the elongated channel 154 formed in the housing 102 and associated with the elongated contact pin 110. At least a portion of the intermediate section 406 of the flexible PCB 400 may also be disposed in the channels (e.g., in the elongated channel 154).

The intermediate section 406, being itself flexible and/or plastically deformable, may be bent around the distal end 428 of the frame 408, and/or caused to conform to the particular shape of the distal end 428. The elongated contact pin 110 may include or define a downward-facing surface 430, and the intermediate section 406 may include or define a corresponding upward-facing surface 432. The distal section 426 of the frame 408 may form a cantilever-type and/or coil-type spring. In accordance with embodiments of the present disclosure, a force preload (e.g., causing a certain initial amount of flexure of the distal section 426 relative to the housing 402) may be applied to, and/or contained within, the distal section 426, wherein a magnitude of such preload may be at least sufficient to create and maintain intimate physical communication between the respective downward- and upward-facing surfaces 430, 432, and/or not so large as to impart a substantial degree of resistance to downward deflection or movement of the elongated contact pin 110 within the housing 102. As will also be discussed in greater detail hereinafter, and in accordance with embodiments of the present disclosure, the frame 408 may be configured and adapted to generate and apply a pressing force to a downward-facing surface 434 of the intermediate section 406 opposite the upward-facing surface 432 thereof, wherein a magnitude of such pressing force may be at least sufficient to keep the respective downward- and upward-facing surfaces 430, 432 in intimate (e.g., sliding) contact with each other as the elongated contact pin 110 and the flexible PCB 400 translate and/or otherwise move relative to each other, e.g., both in the vertical direction, and in the horizontal direction.

The free end portion 414 of the elongated contact pin 110, as well as that of the elongated contact pin 112, as well as that of each of the other elongated contact pins 104, 106, 108, 114, 116, and 118 (FIG. 1), may form a foot 436, wherein the foot 436 may extend beneath the forward region 144 of the upper wall 142 of the housing 102. The foot 436 may include an upward-facing surface 438, and the upper wall 142 may include a corresponding downward-facing surface 440. Each of the elongated contact pin 110 and the other elongated contact pins 104, 106, 108, 112, 114, 116 and 118 may be mounted in cantilevered fashion with respect to the housing 102 so as to maintain a slight upward bias or preload, which bias or preload may tend to cause the upward-facing surface 438 of the foot 436 to achieve and maintain intimate physical contact with the downward-facing surface 440 of the upper wall 134, thereby substantially defining an upper limit to the extent to which the distal extents 126 of the elongated contact pins 104, 106, 108, 110, 112, 114, 116, and 118 are permitted to rise relative to the housing 102. In accordance with embodiments of the present disclosure, and as described in greater detail below, such an arrangement may be advantageous at least insofar as it promotes substantial uniformity with respect to the overall rearward-facing profile that the distal and intermediate extents 126, 124 of the elongated contact pins 104, 106, 108, 110, 112, 114, 116, and 118 are collectively capable of presenting to the corresponding contacts of such separate (e.g., mating) connectors as may be placed in contact with the insert device 100 (e.g., as part of a noise-compensating communications connector system).

The distal extent 126 of each of the elongated contact pins 104, 106, 108, 110, 112, 114, 116, and 118 may further include a slanted extent 442 adjacent to and extending rearwardly and upwardly from the free end portion 414 thereof, wherein with respect to the elongated contact pins 104, 108, 112, and 116 of the upper plurality, the slanted extent 442 may extend between the free end portion 414 and the main downward bend 170, and with respect to the elongated contact pins 106, 110, 114, and 118 of the lower plurality, the slanted extent 442 may extend between the free end portion 414 and the main downward bend 172. The slanted extent 442 may encompass the downward-facing surface 430 described above, and describe an angle 444 with the horizontal when the upward-facing surface 438 of the foot 436 is in intimate physical contact with the downward-facing surface 440 of the upper wall 134. In accordance with embodiments of the present disclosure, the slanted extent 442 may define a substantially straight and linear shape, and may be sized and dimensioned such that the angle 444 is an angle falling within a range of from about 40 degrees to about 50 degrees. For example, the angle 444 may be an angle of between about 43 degrees and about 47 degrees (e.g., an angle of about 45 degrees), such a slope, together with a substantially straight and linear shape for the slanted extent 442, being advantageous at least insofar as it facilitates maintaining intimate sliding physical communication between the downward facing surface 430 of the slanted extent 442 and the upward-facing surface 432 of the intermediate section 406 of the flexible PCB 400 as the slanted extent 442 is pushed downward relative to the flexible PCB 400 in accordance with aspects of operation of the insert device 100 described in greater detail hereinafter.

Each of the elongated contact pins 104, 106, 108, 110, 112, 114, 116, and 118 may further describe an upward-facing surface 446. For example, with respect to the elongated contact pins 104, 108, 112, and 116 of the upper plurality, the upward-facing surface 446 may be formed by corresponding adjacent portions of the slanted extent 442 and the main downward bend 170. For another example, with respect to the elongated contact pins 106, 110, 114, and 118 of the lower plurality, the upward-facing surface may be formed by corresponding adjacent portions of the slanted extent 442 and the main downward bend 172. The structure and function of the upward-facing surface 446 will be explained further below.

Figure 5:
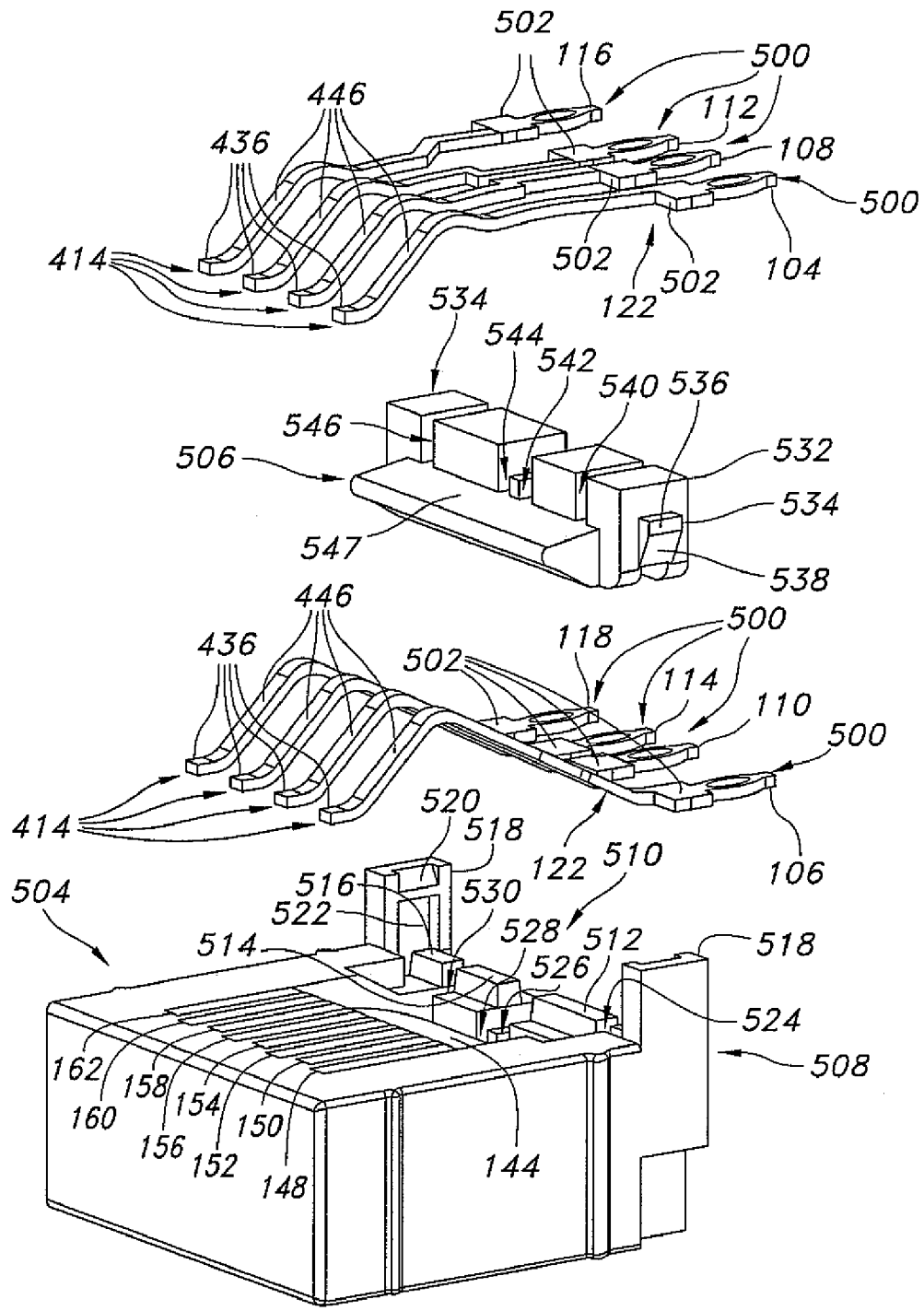
FIG. 5 is a perspective exploded assembly view of the insert device of FIG. 1, including wherein the flexible PCB and the frame of the reactance unit of FIG. 4 are similarly shown in the form of an exploded assembly.
Figure 5:
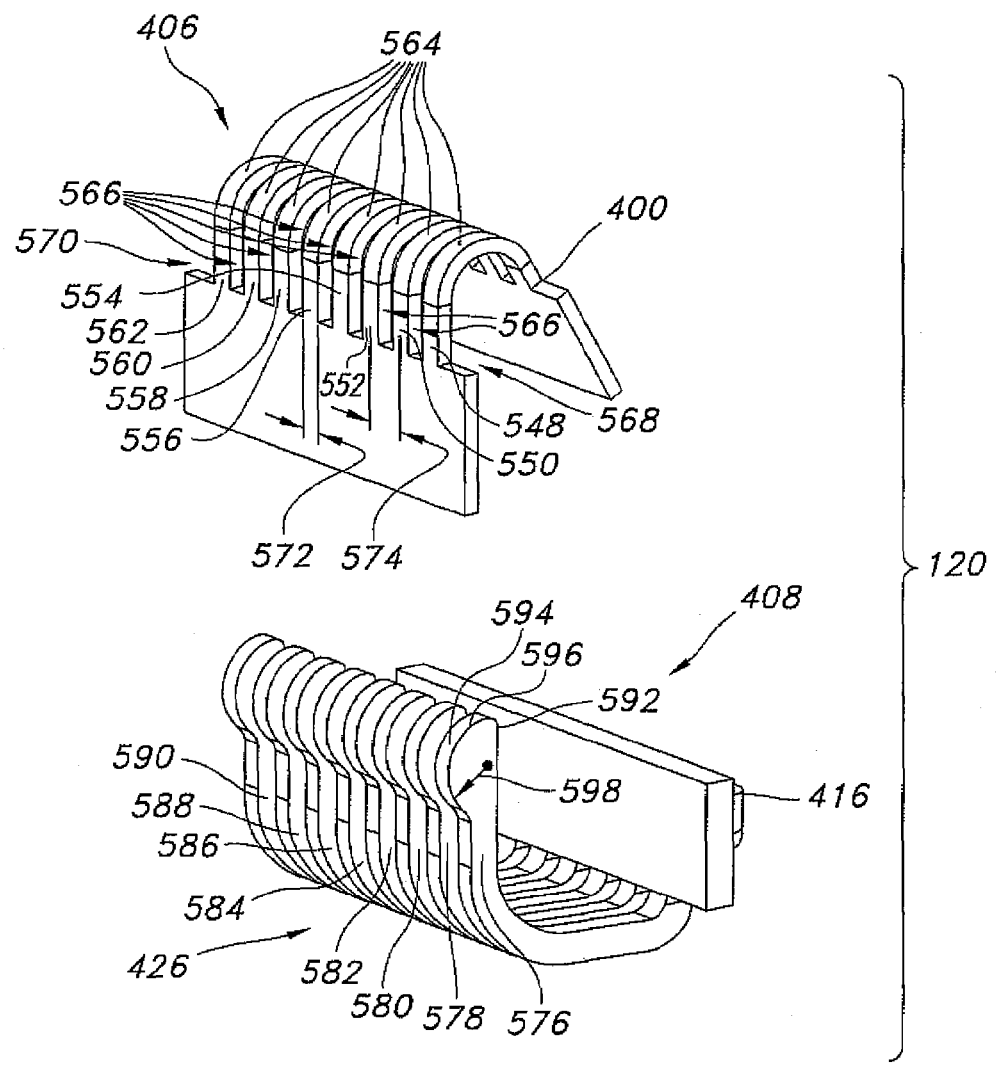

Turning now to FIG. 5, the respective free end portions 414 and feet 436 of each of the elongated contact pins 104, 108, 112, and 116 of the upper plurality and the elongated contact pins 106, 110, 114, and 118 of the lower plurality are clearly depicted, as are the upward-facing surfaces 446 thereof. In accordance with embodiments of the present disclosure, the respective proximal extents 122 of the elongated contact pins 104, 106, 108, 110, 112, 114, 116, and 118 may be equipped with features and design aspects which: 1) facilitate the formation of a cantilever-type mounting arrangement with corresponding features of the housing 102 (FIG. 1), 2) provide exemplary lead frame arrangements wherein respective ones of the upper plurality of elongated contact pins 104, 10S, 112, and 116 may be paired with corresponding ones of the lower plurality of elongated contact pins 106, 110, 114 and 118 in an overlying/substantially overlying arrangement for a prescribed distance, and/or 3) provide exemplary lead frame arrangements wherein respective ones of the upper plurality of elongated contact pins 104, 108, 112, and 116 may be paired with another one of the same plurality, or wherein respective ones of the lower plurality of elongated contact pins 106, 110, 114, and 118 may be paired with another one of the same plurality, in a coplanar/substantially coplanar and adjacent (e.g., side-by-side alignment) arrangement for a prescribed distance.

In an example of the first of the above-listed three items, each of the elongated contact pins 104, 106, 108, 110, 112, 114, 116, and 118 may include or describe respective proximal ends 500 thereof equipped with features adapted or configured to permit the pins to interact with and/or be mounted together or in common to a substantially planar printed circuit board (not separately shown), and portions (e.g., portions of the lead frame) of the respective proximal extents 122 of the elongated contact pins 104, 106, 108, 110, 112, 114, 116, and 118 adjacent to the proximal ends 500 thereof may comprise relatively broad planar or plate-like sections 502. The structure and function of such planar or plate-like sections 502 will be discussed in greater detail below.

In an example of the second of the above-listed three items, portions (e.g., portions of the lead frame) of the respective proximal extents 122 of the elongated contact pins 104 and 106 may be in an overlying/substantially overlying arrangement for a prescribed distance, portions (e.g., portions of the lead frame) of the respective proximal extents 126 of elongated contact pins 112 and 110 may be in an overlying/substantially overlying arrangement for a prescribed distance, and/or portions (e.g., portions of the lead frame) of the respective proximal extents 122 of elongated contact pins 116 and 118 may be in an overlying/substantially overlying arrangement for a prescribed distance. Such overlying or substantially overlying arrangement of lead frames may be effective to impart capacitive coupling to the aligned lead frames, thereby functioning to further balance crosstalk noise introduced thereto in connection with plug/jack interaction in an associated connection system.

In an example of the third of the above-listed three items, portions (e.g., portions of the lead frame) of the respective proximal extents 122 of elongated contact pins 108 and 112 may be in a coplanar/substantially coplanar adjacent relationship for a prescribed distance, and portions (e.g., portions of the lead frame) of the respective proximal extents 122 of elongated contact pins 110 and 114 may be in a coplanar/substantially coplanar adjacent relationship for a prescribed distance. Such coplanar or substantially coplanar adjacent relationship may be effective to impart capacitive coupling to the aligned lead frames, thereby functioning to further balance crosstalk noise introduced thereto in connection with plug/jack interaction in an associated connection system.

Still referring to FIG. 5, the housing 102 (FIG. 1) may include a lower housing portion 504 and an upper housing portion 506, wherein the lower housing portion 504 includes the reaction surface 144, the arrangement of elongated channels 148, 150, 152, 154, 156, 158, 160, and 162, and the cavity 412 (FIG. 4). The lower housing portion 504 may include or exhibit a rear margin 508, and may include or feature a receptacle 510 in a vicinity of the rear margin 508, wherein the receptacle 510 may be sized, shaped, dimensioned and/or configured to receive the upper housing portion 506 and allow the latter to become securely lodged within and/or affixed to the lower housing portion 504. For example, the receptacle 510 may include respective upwardly-directed protrusions 512, 514, and 516 for mating with and/or otherwise interacting with corresponding downwardly-facing sockets or cavities (obscured) formed in the upper housing portion 506 to assist in locating the upper housing portion 506 with respect to the lower housing portion 504 in the horizontal plane. For another example, the receptacle 510 may include opposing respective vertically-oriented rails 518, each rail 518 featuring a beveled surface 520 and a notch 522 for mating with and/or otherwise interacting with corresponding features formed in the upper housing portion 506 to assist in locating the upper housing portion 506 in the vertical plane.

The receptacle 510 may be further sized, shaped, dimensioned and/or configured to receive the respective proximal extents 122 of the elongated contact pins 106, 110, 114, and 118 of the lower plurality and allow the latter to become securely lodged within and/or affixed to the lower housing portion 504. For example, the rear margin 508 and/or the receptacle 510 may include or define a series of slots 524, 526, 528, and 530 for individually receiving and laterally locating or guiding respective lead frame portions associated with corresponding ones of the proximal extents of the elongated contact pins 106, 110, 114, and 118 of the lower plurality. The structure and function of the slots 524, 526, 528, and 530 will be discussed in greater detail below.

In accordance with embodiments of the present disclosure, the reaction surface 144 may be positioned, dimensioned, and configured to define a slope of approximately 30 degrees (e.g., with the horizontal) for the corresponding adjacent ascending portions of the proximal extents 122 of the elongated contact pins 106, 110, 114, and 118 of the lower plurality, and/or to provide for the pre-load stress usable for purposes of mating with a plug (not shown). For example, the reaction surface 144 may serve to increase the contact force associated with each of the elongated contact pins 106, 110, 114, and 118 of the lower plurality to about 100 grams or more.

The upper housing portion 506 may include or feature a plug-shaped body 532, wherein the body 532 may be sized, shaped, dimensioned and/or configured to be inserted into the receptacle 510 and between the rails 518 of the lower housing portion 502, and/or to become securely lodged therewithin and/or affixed thereto. For example, the body 532 may include a pair of latches 534 disposed on opposite respective sides of the body 532, wherein each such latch 534 may comprise a protrusion 536 and a beveled surface 538, and may be configured to interoperate with complementary features of a corresponding one of the rails 518 of the lower housing portion 504.

The body 532 may be further sized, shaped, dimensioned and/or configured to receive the respective proximal extents 122 of the elongated contact pins 104, 108, 112, and 116 of the upper plurality and allow the latter to become securely lodged within and/or affixed to the upper housing portion 506. For example, the body 532 may include or define a series of slots 540, 542, 544, and 546 for individually receiving and laterally locating or guiding respective lead frame portions associated with corresponding ones of the proximal extents of the elongated contact pins 104, 108, 112, and 116 of the upper plurality. The structure and function of the slots 540, 542, 544, and 546 will be discussed in greater detail below.

The body 532 of the upper housing portion 506 may further include or define a reaction surface 547 disposed beneath the respective proximal extents 122 of the elongated contact pins 104, 108, 112, and 116 of the upper plurality. In accordance with embodiments of the present disclosure, the reaction surface 547 may be positioned, dimensioned, and/or configured to provide for the pre-load stress usable for purposes of mating with a plug (not shown). For example, the reaction surface 547 may serve to increase the contact force associated with each of the elongated contact pins 104, 108, 112, and 116 of the upper plurality to about 100 grams or more.

Continuing to refer to FIG. 5, the intermediate section 406 of the flexible PCB 400 may include or define an arrangement of eight elongated interconnection elements 548, 550, 552, 554, 556, 558, 560, 562 extending between (e.g., from one to the other of) the first and second end sections 402, 404. Each of the eight elongated interconnection elements 548, 550, 552, 554, 556, 558, 560, 562 may define or include a respective upward-facing surface 564 (e.g., wherein collectively, the upward-facing surfaces 564 may define the above-described upward-facing surface 432 (FIG. 4) of the intermediate section 406), the structure and function of such upward-facing surfaces 564 being described in greater detail below.

In accordance with embodiments of the present disclosure, each individual elongated interconnection element of the arrangement of eight thereof may be physically separated from each of the others thereof. For example, the intermediate section 406 may include or define an arrangement of seven slots 566 extending entirely through the material of the intermediate section 406 and located between individual adjacent pairs of the ones of the arrangement of eight elongated interconnection elements 548, 550, 552, 554, 556, 558, 560, 562, and a pair of cutouts 568 and 570 extending entirely through the material of the intermediate section 406 and located on respective opposite sides of such arrangement (e.g., respectively adjacent to the interconnection elements 548 and 562).

The arrangement of eight elongated interconnection elements 548, 550, 552, 554, 556, 558, 560, 562 may in turn describe respective width dimensions 572 for each such element, as well as corresponding center-to-center spacing dimensions 574 as between adjacent pairs of such elements. In accordance with embodiments of the present disclosure, each of the width dimensions 572 is narrow enough, and each of the center-to-center spacing dimensions 574 is of an appropriate size, to permit each of the elongated interconnection elements 548, 550, 552, 554, 556, 558, 560, 562: 1) to fit within and extend at least partially (or alternatively, entirely) upward and through corresponding ones of the elongated channels 148, 150, 152, 154, 156, 158, 160, and 162 (FIGS. 1 and 4), and/or 2) to electrically and/or physically interact (e.g., via sliding contact) with corresponding ones of the elongated contact pins 104, 106, 108, 110, 112, 114, 116, and 118 (FIGS. 1 and 4).

The distal section 426 of the frame 408 may include or define an arrangement of eight elongated support elements 576, 578, 580, 582, 584, 586, 588, and 590, each of which extends both horizontally (e.g., forward) and vertically (e.g., initially downward, and eventually upward) from the mounting feature 416 and terminates at a respective support tip 592 ordinarily (e.g., when not subjected to external forces) substantially coincident with the overall distal end 428 of the frame 408. Each respective support tip 592 may include or define a curved support surface 594 around which the elongated interconnection elements 548, 550, 552, 554, 556, 558, 560, 562 may be wrapped, formed, and/or bent so as to cause the respective upward facing surfaces 564 of the elongated interconnection elements 548, 550, 552, 554, 556, 558, 560, 562 (which surfaces 564 may be used to achieve and/or maintain intimate physical communication with the corresponding downward-facing surfaces 424 of the elongated contact pins 104, 106, 108, 110, 112, 114, 116, and 118), to exhibit or describe a corresponding curved profile 596 suitable for allowing the elongated interconnection elements 548, 550, 552, 554, 556, 558, 560, 562 to maintain physical contact with the elongated interconnection elements 548, 550, 552, 554, 556, 558, 560, 562 while simultaneously moving or translating relative to the same (e.g., sliding across the same).

The shape of each curved support surface 594 may be defined by a radius 598 such that the curved support surface 594 substantially describes a cylindrical section. In accordance with embodiments of the present disclosure, the cylindrical section may have an angular extent of between about 90 and 170 degrees (e.g., about 135 degrees). Other angular extents for the cylindrical section are possible. In accordance with embodiments of the present disclosure, the radius 598 may be a radius having of a length extent of between about 1.4 mm and about 2.8 mm (e.g., about 2.4 mm). Other length extents for the radius 598 are possible.

Rather than being mechanically attached to any other portion or component of the insert device 100, or bearing a conventional mounting relationship with respect to the housing 102 thereof, the flexible PCB 400 may be substantially free floating within an allowable range of motion. The range of motion of the flexible PCB 400 in the upward vertical direction may be limited or restricted by the elongated contact pins 104, 106, 108, 110, 112, 114, 116, and 118 of the arrangement 103 within the elongated channels 148, 150, 152, 154, 156, 158, 160, and 162 pressing at least partially downwardly on the respective elongated interconnection elements 548, 550, 552, 554, 556, 558, 560, 562, and by the presence of the undersides 410 of the channel walls 142 setting an upper limit to the degree to which the first and second end sections 402 and 404 of the flexible PCB 400 may rise within the cavity 412 defined by the housing 102. The range of motion of the flexible PCB 400 in the downward vertical direction may be limited or restricted by virtue of the flexible (e.g., movable, form-fitting) support supplied to the elongated interconnection elements 548, 550, 552, 554, 556, 558, 560, 562 by the distal ends 592 of the elongated support elements 576, 578, 580, 582, 584, 586, 588, and 590 of the frame 408.

The range of motion of the flexible PCB 400 in the forward axial horizontal direction may be limited or restricted by the elongated contact pins 104, 106, 108, 110, 112, 114, 116, and 118 of the arrangement 103 within the elongated channels 148, 150, 152, 154, 156, 158, 160, and 162 pressing at least partially rearwardly on the respective elongated interconnection elements 548, 550, 552, 554, 556, 558, 560, 562, by the presence of the undersides 410 of the channel walls 142 setting an forward limit to the degree to which the first and second end sections 402 and 404 of the flexible PCB 400 may advance within the cavity 412 defined by the housing 102, and by virtue of the flexible support supplied to the elongated interconnection elements 548, 550, 552, 554, 556, 558, 560, 562 by the distal ends 592 of the elongated support elements 576, 578, 580, 582, 584, 586, 588, and 590 of the frame 408. The range of motion of the flexible PCB 400 in the rearward axial horizontal direction may be limited or restricted by the presence of the undersides 410 of the channel walls 142 setting an forward limit to the degree to which the first and second end sections 402 and 404 of the flexible PCB 400 may retreat within the cavity 412 defined by the housing 102, and by virtue of the flexible (e.g., movable, form-fitting) support supplied to the elongated interconnection elements 548, 550, 552, 554, 556, 558, 560, and 562 of the flexible PCB 400 by the distal ends 592 of the elongated support elements 576, 578, 580, 582, 584, 586, 588, and 590 of the frame 408. And the range of motion of the flexible PCB 400 in each of the transverse or lateral horizontal directions (e.g., into and out of the paper of FIG. 4) may be limited or restricted by virtue of the relatively close confinement of each of the elongated interconnection elements 548, 550, 552, 554, 556, 558, 560, and 562 of the flexible PCB 400 within a corresponding one of the elongated channels 148, 150, 152, 154, 156, 158, 160, and 162 by opposing respectively adjacent instances of the channel walls 142, as well as by the similarly relatively close confinement of the first and second end sections 402, 404 of the flexible PCB within the cavity 412 by the opposing side walls 130, 132 of the housing 102.

Figure 6:
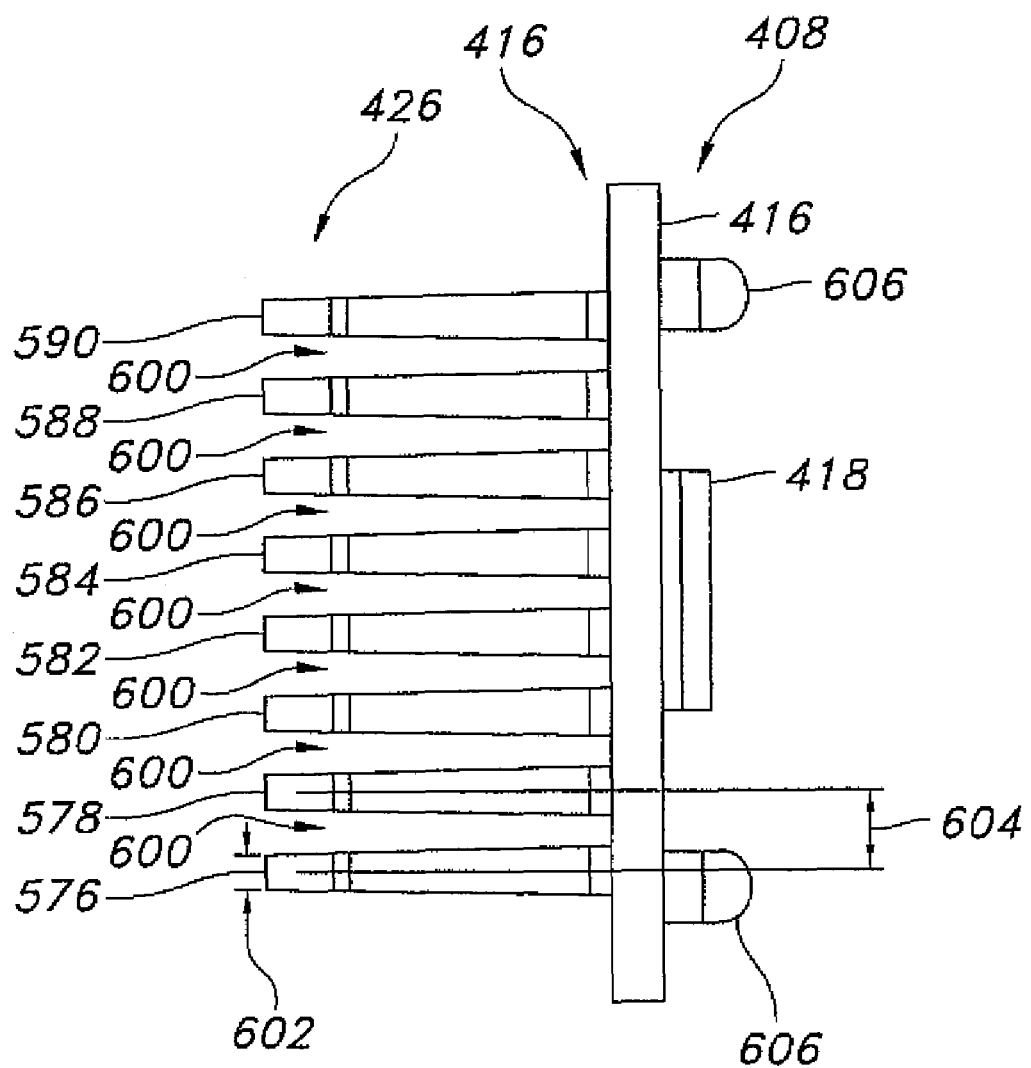
FIG. 6 is a top plan view of the frame of the reactance unit of FIGS. 4 and 5.

In accordance with embodiments of the present disclosure, each individual elongated support element 576, 578, 580, 582, 584, 586, 588, and 590 of the arrangement of eight thereof may be physically separated from each other thereof in the vertical plane. For example, and as best shown in FIG. 6, the distal section 426 of the frame 408 may include or define an arrangement of seven slots 600 extending entirely through the material of the distal section 426 and located between individual adjacent instances of the arrangement of elongated support elements 576, 578, 580, 582, 584, 586, 588, and 590. The arrangement of eight elongated support elements 576, 578, 580, 582, 584, 586, 588, and 590 may in turn describe respective width dimensions 602 that are narrow enough, as well as individual and/or collective center-to-center spacing dimensions 604 that are similarly appropriate, to permit each of the elongated support elements 576, 578, 580, 582, 584, 586, 588, and 590 to fit within and extend upward through the elongated channels 148, 150, 152, 154, 156, 158, 160, and 162 (FIG. 1), and/or to physically contact and provide support for corresponding ones of the eight elongated interconnection elements 548, 550, 552, 554, 556, 558, 560, 562 of the intermediate section 406 of the flexible PCB 400 (FIGS. 4 and 5).

Still referring to FIG. 6, the proximal section 414 of the frame 408, in addition to including respective vertically- and horizontally-extending mounting features 416 and 418, also includes two additional vertically-extending mounting features 606 adapted to cooperate with corresponding receiving structures of the housing 102 (FIGS. 1 and 4) to assist in ensuring that the frame 408 is securely affixed relative to other structures and components of the insert device 100 (FIGS. 1 and 4).

Figure 7:
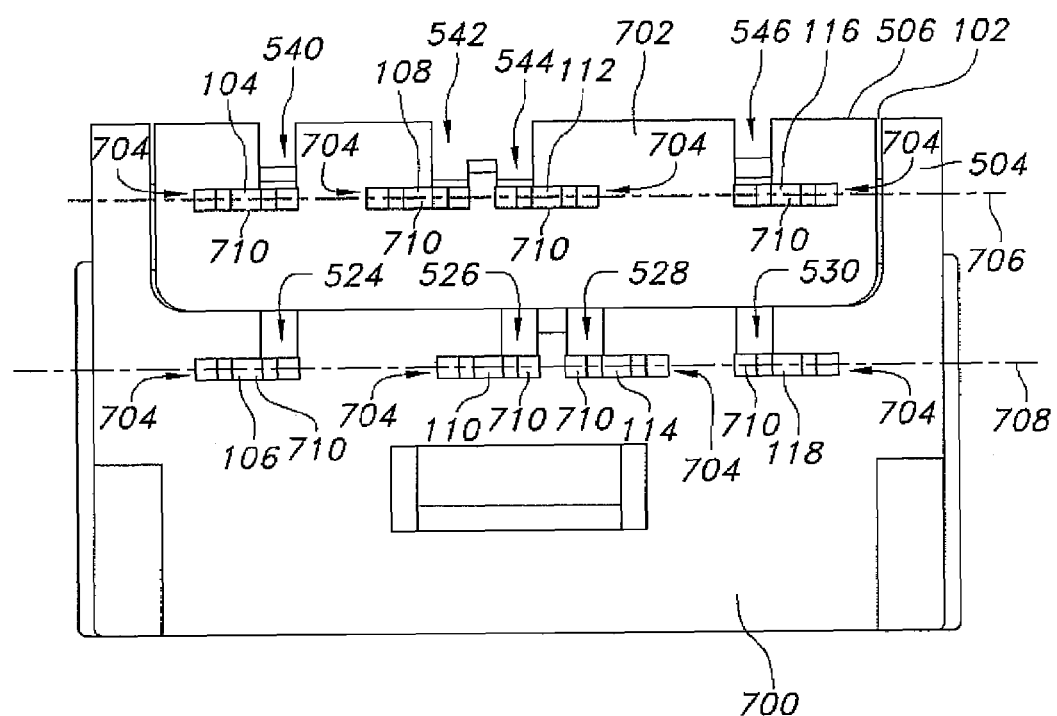
FIG. 7 is a rear elevational view of the insert device of FIG. 1.

Referring now to FIG. 7, the insert device 100 may support the eight elongated contact pins 104, 106, 108, 110, 112, 114, 116, and 118 in accordance with most standard wiring formations, thereby accommodating RJ45 plugs according to the T568B and T568A standards. The TIA/EIA commercial building standards have defined category 5e to 6A electrical performance parameters for higher bandwidth (from about 100 MHz to about 500 MHz) systems. In category 5e and 6A, the TIA/EIA RJ45 wiring style is currently preferred and is followed throughout the cabling industry.

As indicated above, the respective proximal extents 122 (FIG. 5) of the elongated contact pins 104, 108, 112, and 116 of the upper plurality may be engaged in corresponding ones of the slots 540, 542, 544, and 546 formed in the upper housing portion 506, and the respective proximal extents 122 (FIG. 5) of the elongated contact pins 106, 110, 114, 118 of the lower plurality may be engaged in corresponding ones of the slots 524, 526, 528, and 530 formed in the lower housing portion 504. Each of the lower and upper housing portions 504, 506 of the housing 102 may in turn include respective rear walls 700, 702, wherein respective arrangements of substantially coplanar T-shaped cutouts or undercuts 704 may be formed in or defined by the respective rear walls 700, 702. Each of the respective planar or plate-like sections 502 (FIG. 5) of the elongated contact pins 104, 108, 112, and 116 of the upper plurality may be engaged in and/or captured by a corresponding one of the arrangement of undercuts 704 formed in the rear wall 700 of the upper housing portion 506, and each of the respective planar or plate-like sections 502 of the elongated contact pins 106, 110, 114, and 118 of the lower plurality may be engaged in and/or captured by a corresponding one of the arrangement of undercuts 704 formed in the rear wall 702 of the lower housing portion 504. The interaction between the T-shaped undercuts 704 and the associated planar or plate-like sections 502 of the elongated contact pins may be effective to support the elongated contact pins in a cantilevered manner. Such interaction may also, or alternatively, support and align the elongated contact pins in position prior to being inserted into a PCB (not separately shown).

As shown in FIG. 7, the elongated contact pins 104, 108, 112, and 116 of the upper plurality may define a first plane 706 as they exit the rear wall 700 of the upper housing portion 504. The elongate contact pins 106, 110, 114, and 118 of the lower plurality may define a second plane 708 substantially parallel to the first plane as they exit the rear wall 702 of the lower housing portion 506. In accordance with embodiments of the present disclosure, each of the elongated contact pins 104, 106, 108, 110, 112, 114, 116, and 118 may include or define a proximal end 710 configured and adapted to mate with corresponding mounting features of a PCB (not separately shown), including but not limited to mating with corresponding through-holes of a PCB, within which the proximal ends 710 may be electrically and mechanically attached to the PCB via corresponding solder joints (not shown).

Figure 8:
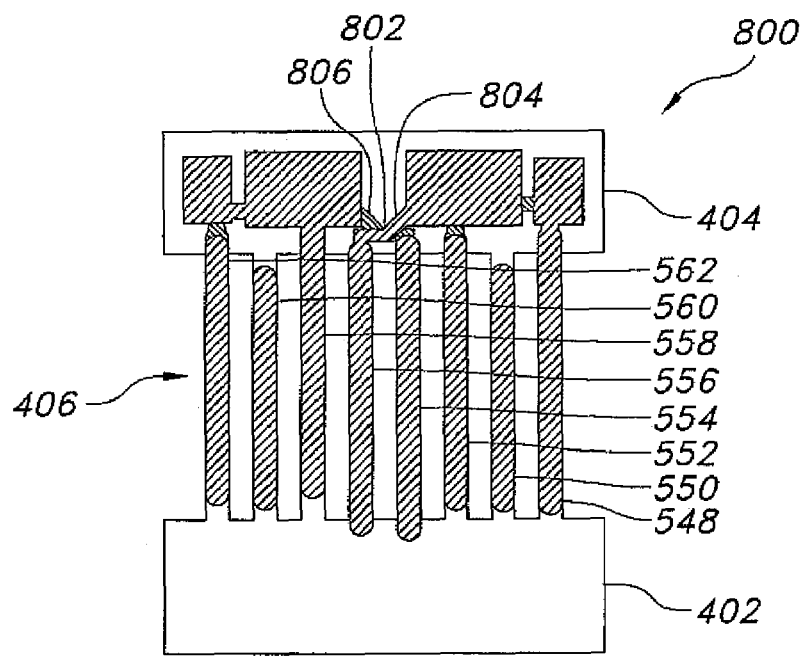
FIG. 8 is a schematic top plan view of a first variation of the reactance circuit embodied by the flexible PCB of FIGS. 4 and 5, including at least partial depictions of certain of the conductive layers thereof.

With reference now to FIG. 8, a flexible PCB 800 is shown, wherein the flexible PCB 800 may embody a first variation of the flexible PCB 400. The flexible PCB 800 is shown in top plan view, including wherein the upward-facing surfaces 564 (FIG. 5) of the eight elongated interconnection elements 548, 550, 552, 554, 556, 558, 560, 562 of the intermediate section 406 appear, as do the first and second end sections 402, 404 between which such interconnection elements extend. A reactance circuit 802 embodied by the flexible PCB 800 may include a plurality of conductive surfaces or layers, including a first layer 804 and a second layer 806 shown in overlapping fashion in FIG. 8.

Figures 9, 10:
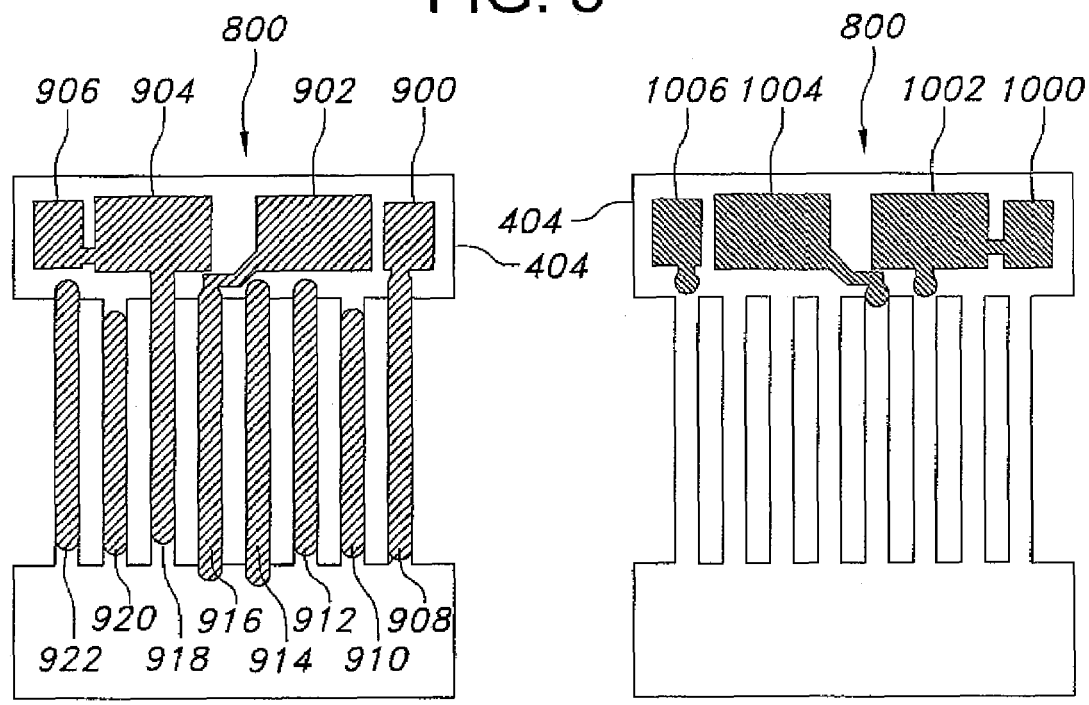
FIG. 9 is a schematic plan view of one of the conductive layers of the reactance circuit of FIG. 8.
FIG. 10 is a schematic plan view of another one of the conductive layers of the reactance circuit of FIG. 8.

As shown in FIG. 9, the first layer 804 may include a plurality of conductors sized, shaped, configured and/or located for use as respective capacitor terminations. For example, the first layer 804 may include respective first, second, third, and fourth conductors 900, 902, 904, 906 disposed in the second end section 404 of the flexible PCB 800. Each of the conductors 900, 902, 904, and 906 may be a substantially planar square or rectangular metallic pad/plate. The first layer 804 may further include an arrangement of conductors sized, shaped, configured and/or located to achieve, facilitate and/or maintain an effective electrical connection between the elongated contact pins 104, 106, 108, 110, 112, 114, 116, and 118 (FIGS. 1 and 5) and the reactance circuit 802 (FIG. 8). For example, the first layer 804 may include an arrangement of metallic traces 908, 910, 912, 914, 916, 918, 920, and 922, wherein each of the elongated interconnection elements 548, 550, 552, 554, 556, 558, 560, 562 (FIG. 8) may incorporate or include a corresponding individual one of the metallic traces 908, 910, 912, 914, 916, 918, 920, and 922.

Turning now to FIG. 10, the second layer 806 may include a plurality of conductors sized, shaped, configured and/or located for use as respective capacitor terminations. For example, the second layer 806 may include respective fifth, sixth, seventh, and eighth conductors 1000, 1002, 1004, 1006 disposed in the second end section 404 of the flexible PCB 800. Each of the conductors 1000, 1002, 1004, 1006 may be a substantially planar square or rectangular metallic pad/plate. Referring now to both FIG. 9 and FIG. 10: 1) the metallic trace 908 associated with the elongated interconnection element 548 and the elongated contact pin 104 (FIG. 1) is electrically coupled to the first conductor 900; 2) the metallic trace 910 associated with the elongated interconnection element 550 and the elongated contact pin 106 (FIG. 1) is electrically isolated; 3) the metallic trace 912 associated with the elongated interconnection element 552 and the elongated contact pin 108 (FIG. 1) is in intimate electrical communication with the sixth conductor 1002, and is in indirect electrical communication with the fifth conductor 1000 (by virtue of the fifth and sixth conductors 1000, 1002 being in direct electrical communication with each other); 4) the metallic trace 914 associated with the elongated interconnection element 554 and the elongated contact pin 110 (FIG. 1) is in electrical communication with the seventh conductor 1004; 5) the metallic trace 916 associated with the elongated interconnection element 556 and the elongated contact pin 112 (FIG. 1) is in electrical communication with the second conductor 902; 6) the metallic trace 918 associated with the elongated interconnection element 558 and the elongated contact pin 114 (FIG. 1) is in direct electrical communication with the third conductor 904, and is in indirect electrical communication with the fourth conductor 906 (by virtue of the third and fourth conductors 904, 906 being in direct electrical communication with each other); 7) the metallic trace 920 associated with the elongated interconnection element 560 and the elongated contact pin 116 (FIG. 1) is electrically isolated; and 8) the metallic trace 922 associated with the elongated interconnection element 562 and the elongated contact pin 118 (FIG. 1) is in electrical communication with the eighth conductor 1006.

Referring now to FIGS. 1, 8, 9, and 10, in accordance with embodiments of the present disclosure, the insert device 100 (FIG. 1) is operable via the flexible PCB 800 to create and/or maintain direct electrical communication between each individual one of the metallic traces 908, 910, 912, 914, 916, 920, 922, and 924 of the elongated interconnection elements 548, 550, 552, 554, 556, 558, 560, 562 and the corresponding individual one of the elongated contact pins 104, 106, 108, 110, 112, 114, 116, and 118. The structures and functions associated with the creation and/or maintenance of such separate instances of direct electrical communication will be described in greater detail below. Presuming for the purposes of the immediate discussion the existence of each such separate instance of direct electrical communication, the insert device 100 may exhibit the following electrical characteristics: 1) a first capacitor may be formed via associated electrical interaction between the first and fifth conductors 900, 1000 for inducing capacitive coupling between the elongated contact pin 104 and the elongated contact pin 108; 2) a second capacitor may be formed via associated electrical interaction between the second and sixth conductors 902, 1002 for inducing capacitive coupling between the elongated contact pin 108 and the elongated contact pin 112; 3) a third capacitor may be formed via associated electrical interaction between the third and the seventh conductors 904, 1004 for inducing capacitive coupling between the elongated contact pin 110 and the elongated contact pin 114; 4) a fourth capacitor may be formed via associated electrical interaction between the fourth and eight conductors 906, 1006 for inducing capacitive coupling between the elongated contact pin 114 and the elongated contact pin 118; 5) the elongated contact pin 106 may be isolated from any and all capacitive coupling with the other elongated contact pins; and 6) the elongated contact pin 116 may be similarly isolated from any and all capacitive coupling with the other elongated contact pins. In such circumstances, and in accordance with embodiments of the present disclosure, the reactance circuit 802 may be effective to reduce and/or at least partially eliminate an incidence of NEXT noises arising from, associated with, and/or present in the following pairs of elongated contact pins: 104 and 108, 108 and 112, 110 and 114, and 114 and 118.

All FIGS. 8-11 conductors 900, 902, 904, 906, 1000, 1002, 1004, and 1006 are located on one end of the flexible PCB 400. FIGS. 11-13 depict an embodiment of the present disclosure in which capacitive conductors are separated and/or disposed at opposite ends of the flexible PCB 400. The latter arrangement may be advantageous insofar as it may improve the reactive balance of the circuitry by reducing the interaction between adjacent and non-coupling conductors.

With reference now to FIG. 11, a flexible PCB 1100 is shown, wherein the flexible PCB 1100 may embody a second variation of the flexible PCB 400. The flexible PCB 1100 is shown in top plan view, including wherein the upward-facing surfaces 564 (FIG. 5) of the eight elongated interconnection elements 548, 550, 552, 554, 556, 558, 560, 562 of the intermediate section 406 appear, as do the first and second end sections 402, 404 between which such interconnection elements extend. A reactance circuit 1102 embodied by the flexible PCB 1100 may include a plurality of conductive surfaces or layers, including a first layer 1104 and a second layer 1106 shown in overlapping fashion in FIG. 11.

As shown in FIG. 12, the first layer 1104 may include a plurality of conductors sized, shaped, configured and/or located for use as respective capacitor terminations. For example, the first layer 1104 may include respective first and second conductors 1200, 1202 disposed in the first end section 402 of the flexible PCB 1100 and respective third and fourth conductors 1204, 1206 disposed in the second end section 404 thereof. Each of the conductors 1200, 1202, 1204, and 1206 may be a substantially planar square or rectangular metallic pad/plate. The first layer 1104 may further include an arrangement of conductors sized, shaped, configured and/or located to achieve, facilitate and/or maintain an effective electrical connection between the elongated contact pins 104, 106, 108, 110, 112, 114, 116, and 118 (FIGS. 1 and 5) and the reactance circuit 1102 (FIG. 11). For example, the first layer 1104 may include an arrangement of metallic traces 1208, 1210, 1212, 1214, 1216, 1218, 1220, and 1222, wherein each of the elongated interconnection elements 548, 550, 552, 554, 556, 558, 560, 562 (FIG. 11) may incorporate or include a corresponding individual one of the metallic traces 1208, 1210, 1212, 1214, 1216, 1218, 1220, and 1222.

Turning now to FIG. 13, the second layer 1106 may include a plurality of conductors sized, shaped, configured and/or located for use as respective capacitor terminations. For example, the second layer 1106 may include respective fifth and sixth conductors 1300, 1302 disposed in the first section 402 of the flexible PCB 1100, and respective seventh and eighth conductors 1304, 1306 disposed in the second end section 404 thereof. Each of the conductors 1300, 1302, 1304, 1306 may be a substantially planar square or rectangular metallic pad/plate. Referring now to both FIG. 12 and FIG. 13: 1) the metallic trace 1208 associated with the elongated interconnection element 548 and the elongated contact pin 104 (FIG. 1) is electrically coupled to the fifth conductor 1300; 2) the metallic trace 1210 associated with the elongated interconnection element 550 and the elongated contact pin 106 (FIG. 1) is electrically isolated; 3) the metallic trace 1212 associated with the elongated interconnection element 552 and the elongated contact pin 108 (FIG. 1) is in direct electrical communication with the second conductor 1202, and is in indirect electrical communication with the first conductor 1200 (by virtue of the first and second conductors 1200, 1202 being in direct electrical communication with each other); 4) the metallic trace 1214 associated with the elongated interconnection element 554 and the elongated contact pin 110 (FIG. 1) is in electrical communication with the seventh conductor 1304; 5) the metallic trace 1216 associated with the elongated interconnection element 556 and the elongated contact pin 112 (FIG. 1) is in electrical communication with the sixth conductor 1302; 6) the metallic trace 1218 associated with the elongated interconnection element 558 and the elongated contact pin 114 (FIG. 1) is in direct electrical communication with the third conductor 1204, and is in indirect electrical communication with the fourth conductor 1206 (by virtue of the third and fourth conductors 1204, 1206 being in direct electrical communication with each other); 7) the metallic trace 1220 associated with the elongated interconnection element 560 and the elongated contact pin 116 (FIG. 1) is electrically isolated; and 8) the metallic trace 1222 associated with the elongated interconnection element 562 and the elongated contact pin 118 (FIG. 1) is in electrical communication with the eighth conductor 1306.

Figure 14:
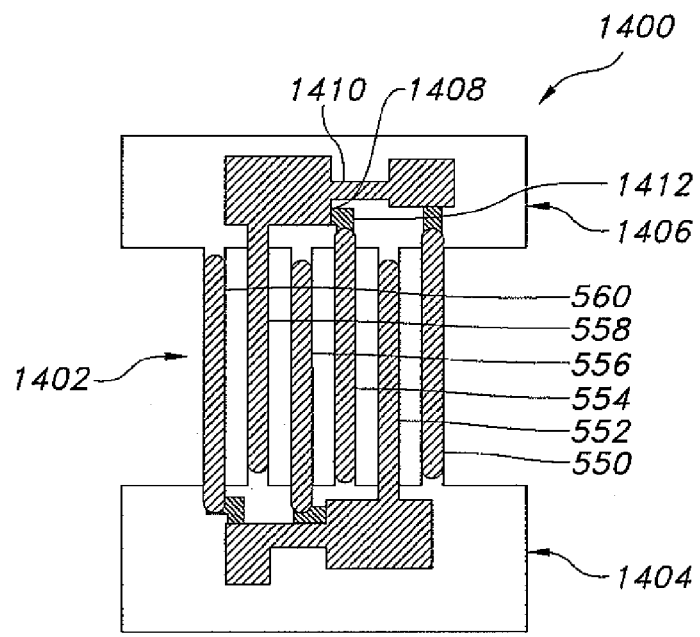
FIG. 14 is a schematic top plan view of a modified version of the reactance circuit embodied by the flexible PCB of FIGS. 4 and 5, including at least partial depictions of certain of the conductive layers thereof.
Figures 15, 16:
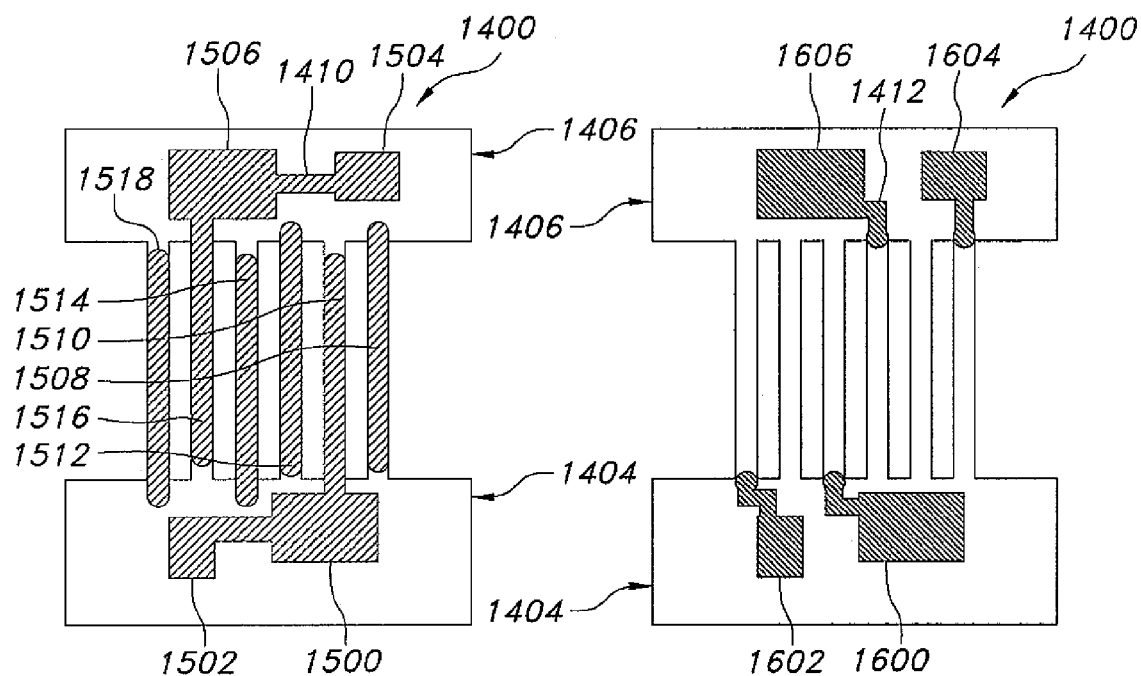
FIG. 15 is a schematic plan view of one of the conductive layers of the reactance circuit of FIG. 14.
FIG. 16 is a schematic plan view of another one of the conductive layers of the reactance circuit of FIG. 14.

Referring now to FIGS. 1, 11, 12, and 13, in accordance with embodiments of the present disclosure, the insert device 100 (FIG. 1) is operable via the flexible PCB 1100 to create and/or maintain direct electrical communication between each individual one of the metallic traces 1208, 1210, 1212, 1214, 1216, 1218, 1220, and 1222 of the elongated interconnection elements 548, 550, 552, 554, 556, 558, 560, 562 and the corresponding individual one of the elongated contact pins 104, 106, 108, 110, 112, 114, 116, and 118. The structures and functions associated with the creation and/or maintenance of such separate instances of direct electrical communication will be described in greater detail below. Presuming for the purposes of the immediate discussion the existence of each such separate instance of direct electrical communication, the insert device 100 may exhibit the following electrical characteristics: 1) a first capacitor may be formed via associated electrical interaction between the first and fifth conductors 1200, 1300 for inducing capacitive coupling between the elongated contact pin 104 and the elongated contact pin 108; 2) a second capacitor may be formed via associated electrical interaction between the second and sixth conductors 1202, 1302 for inducing capacitive coupling between the elongated contact pin 108 and the elongated contact pin 112; 3) a third capacitor may be formed via associated electrical interaction between the third and the seventh conductors 1204, 1304 for inducing capacitive coupling between the elongated contact pin 110 and the elongated contact pin 114; 4) a fourth capacitor may be formed via associated electrical interaction between the fourth and eight conductors 1206, 1306 for inducing capacitive coupling between the elongated contact pin 114 and the elongated contact pin 118; 5) the elongated contact pin 106 may be isolated from any and all capacitive coupling with the other elongated contact pins; and 6) the elongated contact pin 116 may be similarly isolated from any and all capacitive coupling with the other elongated contact pins. In such circumstances, and in accordance with embodiments of the present disclosure, the reactance circuit 1102 may be effective to reduce and/or at least partially eliminate an incidence of NEXT noises arising from, associated with, and/or present in the following pairs of elongated contact pins: 104 and 108, 108 and 112, 110 and 114, and 114 and 118. FIGS. 8-10 and FIGS. 11-13 depict embodiments of the present disclosure that utilize eight elongated interconnection elements disposed between the two ends of the flexible PCB. FIGS. 14-16 depict an embodiment of the present disclosure that utilizes six elongated interconnection elements in a manner that may achieve compensation coupling between a similar number elongated contact pin pairs.

With reference now to FIG. 14, a flexible PCB 1400 is shown, wherein the flexible PCB 1400 may embody a modified version of the flexible PCB 400. Structural, functional, and other descriptions of the flexible PCB 400 discussed above with reference to FIGS. 1-13 are incorporated in the present discussion of the flexible PCB 1400 to the extent not incompatible therewith. The flexible PCB 1400 is shown in top plan view, including wherein the upward-facing surfaces 564 (FIG. 5) of the elongated interconnection elements 550, 552, 554, 556, 558, and 560 of an intermediate section 1402 appear, as do first and second end sections 1404, 1406 between which such interconnection elements extend (it being noted that the flexible PCB 1400 may include only six elongated interconnection elements, e.g., lacking such structure as might otherwise correspond to elongated interconnection elements 548 and 562 present in flexible PCBs 800 and 1100). A reactance circuit 1408 embodied by the flexible PCB 1400 may include a plurality of conductive surfaces or layers, including a first layer 1410 and a second layer 1412 shown in overlapping fashion in FIG. 14.

As shown in FIG. 15, the first layer 1410 may include a plurality of conductors sized, shaped, configured and/or located for use as respective capacitor terminations. For example, the first layer 1410 may include respective first and second conductors 1500, 1502 disposed in the first end section 1404 of the flexible PCB 1400 and respective third and fourth conductors 1504, 1506 disposed in the second end section 1406 thereof. Each of the conductors 1500, 1502, 1504, and 1506 may be a substantially planar square or rectangular metallic pad/plate. The first layer 1410 may further include an arrangement of conductors sized, shaped, configured and/or located to achieve, facilitate and/or maintain an effective electrical connection between the elongated contact pins 106, 108, 110, 112, 114, and 116 (FIGS. 1 and 5) and the reactance circuit 1408. For example, the first layer 1410 may include an arrangement of metallic traces 1508, 1510, 1512, 1514, 1516, and 1518, wherein each of the elongated interconnection elements 550, 552, 554, 556, 558, and 560 (FIG. 14) may incorporate or include a corresponding individual one of the metallic traces 1508, 1510, 1512, 1514, 1516, and 1518.

Turning now to FIG. 16, the second layer 1412 may include a plurality of conductors sized, shaped, configured and/or located for use as respective capacitor terminations. For example, the second layer 1412 may include respective fifth and sixth conductors 1600, 1602 disposed in the first end section 1404 of the flexible PCB 1400, and respective seventh and eighth conductors 1604, 1606 disposed in the second end section 1406 thereof. Each of the conductors 1600, 1602, 1604, 1606 may be a substantially planar square or rectangular metallic pad/plate. Referring now to both FIG. 15 and FIG. 16: 1) the metallic trace 1508 associated with the elongated interconnection element 550 and the elongated contact pin 106 (FIG. 1) is electrically coupled to the seventh conductor 1604; 2) the metallic trace 1510 associated with the elongated interconnection element 552 and the elongated contact pin 108 (FIG. 1) is in direct electrical communication with the first conductor 1500, and is in indirect electrical communication with the second conductor 1502 (by virtue of the third and fourth conductors 1504, 1506 being in direct electrical communication with each other); 3) the metallic trace 1512 associated with the elongated interconnection element 554 and the elongated contact pin 110 (FIG. 1) is in electrical communication with the eighth conductor 1606; 4) the metallic trace 1514 associated with the elongated interconnection element 556 and the elongated contact pin 112 (FIG. 1) is in electrical communication with the fifth conductor 1500; 5) the metallic trace 1516 associated with the elongated interconnection element 558 and the elongated contact pin 114 (FIG. 1) is in direct electrical communication with the fourth conductor 1506, and is in indirect electrical communication with the third conductor 1504 (by virtue of the third and fourth conductors 1504, 1506 being in direct electrical communication with each other); 6) the metallic trace 1518 associated with the elongated interconnection element 560 and the elongated contact pin 116 (FIG. 1) is in electrical communication with the sixth conductor 1602.

Referring now to FIGS. 1, 14, 15, and 16, in accordance with embodiments of the present disclosure, the insert device 100 (FIG. 1) is operable via the flexible PCB 1400 to create and/or maintain direct electrical communication between each individual one of the metallic traces 1508, 1510, 1512, 1514, 1516, and 1518 of the elongated interconnection elements 550, 552, 554, 556, 558, and 560 and the corresponding individual one of the elongated contact pins 106, 108, 110, 112, 114, and 116. The structures and fictions associated with the creation and/or maintenance of such separate instances of direct electrical communication will be described in greater detail below. Presuming for the purposes of the immediate discussion the existence of each such separate instance of direct electrical communication, the insert device 100 may exhibit the following electrical characteristics: 1) a first capacitor may be formed via associated electrical interaction between the first and fifth conductors 1500, 1600 for inducing capacitive coupling between the elongated contact pin 108 and the elongated contact pin 112; 2) a second capacitor may be formed via associated electrical interaction between the second and sixth conductors 1502, 1602 for inducing capacitive coupling between the elongated contact pin 108 and the elongated contact pin 116; 3) a third capacitor may be formed via associated electrical interaction between the third and the seventh conductors 1504, 1604 for inducing capacitive coupling between the elongated contact pin 106 and the elongated contact pin 114; 4) a fourth capacitor may be formed via associated electrical interaction between the fourth and eighth conductors 1506, 1606 for inducing capacitive coupling between the elongated contact pin 110 and the elongated contact pin 114; 5) the elongated contact pin 104 may be isolated from any and all capacitive coupling with the other elongated contact pins; and 6) the elongated contact pin 118 may be similarly isolated from any and all capacitive coupling with the other elongated contact pins. In such circumstances, and in accordance with embodiments of the present disclosure, the reactance circuit 1102 may be effective to reduce and/or at least partially eliminate an incidence of NEXT noises arising from, associated with, and/or present in the following pairs of elongated contact pins: 108 and 112, 108 and 116, 106 and 114, and 110 and 114.

Other methods of capacitive coupling that can be inherently similar in signal energy coupling from one pair to another on a flexible printed circuit board. One such method could involve the formation of capacitance utilizing inter-digital trace patterns. Inter-digital capacitance patterns are typically E-shape trace formations on a single or double layer printed circuit board.

The conductors 900, 902, 904, 906, 1000, 1002, 1004, 1006, 1200, 1202, 1204, 1206, 1300, 1302, 1304, 1306, 1500, 1502, 1504, 1506, 1600, 1602, 1604, and 1608 may be a limited distance from the point of plug mating contact, thereby reducing the NEXT noises that are created from the plug interaction for plug assemblies that contact the central elongated contact pin pairs (so as to energize capacitive pads/plates). An approximate distance of about 0.0150 inches may be utilized to counterbalance the injected noise, since this is an electrically short distance that produced near instantaneous feedback of balancing noise vectors.

The conductors 900, 902, 904, 906, 1000, 1002, 1004, 1006, 1200, 1202, 1204, 1206, 1300, 1302, 1304, 1306, 1500, 1502, 1504, 1506, 1600, 1602, 1604, and 1608 may be configured, dimensioned, and deployed so as to produce an estimated 1 pF of capacitance reactance. This parameter is affected, at least in part, by the dielectric material (if any) and the spacing of the two opposing surfaces. This arrangement of capacitive balancing structures may serve to reduce the pair to pair noise, which may be introduced to the system by the TIA/EAI T568B/A plug, among other things.

Figure 17:
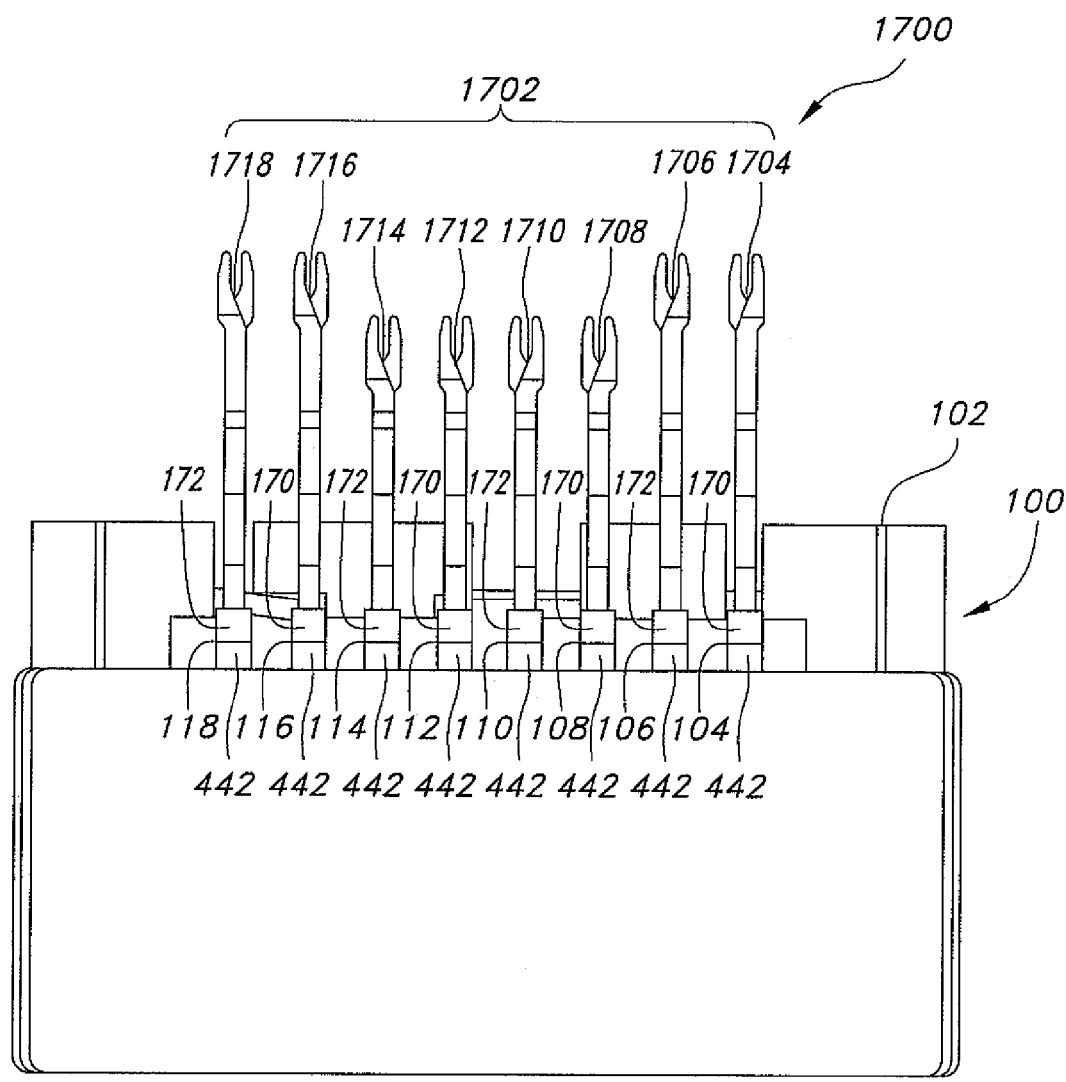
FIG. 17 is a front elevational view of the insert device of FIG. 1 assembled together with a plurality of blade-type electrical contacts characteristic of conventional plug connectors, thereby forming a connection system.

Turning now to FIG. 17, an assembly 1700 is shown (e.g., in the form of a connector system) wherein the insert device 100 of FIG. 1 is in an operating mode in which a complete connection has been effected by and between an arrangement 1702 of connector blades 1704, 1706, 1708, 1710, 1712, 1714, 1716, and 1718 characteristic of a conventional plug connector (not otherwise shown) on the one hand, and the elongated contact pins 104, 106, 108, 110, 112, 114, 116, and 118 of the insert device 100 on the other hand. More particularly, each of the connector blades of the arrangement 1702 is shown positioned atop either a main downward bend 170 associated with one of the elongated contact pin 104, 108, 112, and 116 of the upper plurality, or a main downward bend 172 associated with one of the elongated contact pins 106, 110, 114, and 118 of the lower plurality, wherein the respective slanted extents 442 thereof have for the most part been caused to descend into the housing 102. A process or mating sequence by which such an assembly 1700 may be created is shown and described below with reference to FIGS. 18-21, wherein FIG. 21 in particular represents a sectional side view of the FIG. 17 completed assembly 1700.

Figure 18:
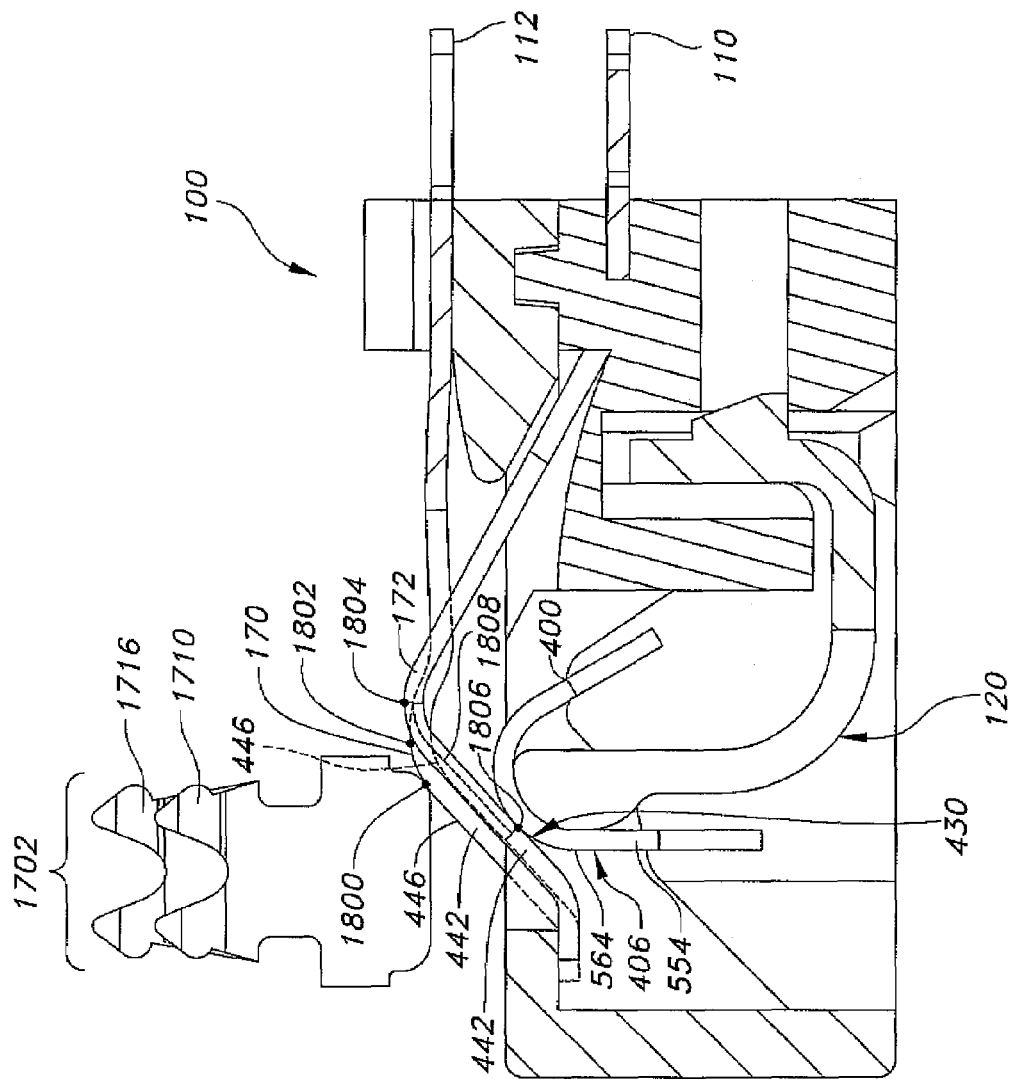

As shown in FIG. 18, the arrangement 1702 of connector blades (including the connector blades 1710 and 1716 that are specifically visible in the front-facing sectional profile the arrangement 1702 set forth in FIG. 18) may be advanced toward the elongated contact pins of the insert device 100 (including the elongated contact pins 110 and 112 that are specifically visible in the side-facing sectional profile of the insert device 100 set forth in FIG. 18) rearwardly and horizontally, and/or substantially along an axial direction within the paper of FIG. 18 from a position (not shown) in front of the housing 102. An initial instance of surface-to-surface contact between the connector blade 1712 (FIG. 17) and the elongated contact pin 112 may occur at a point 1800 on the upward-facing surface 446 of the elongated contact pin 112 in a vicinity of an upper end of the slanted extent 442. Similar initial instances of such surface-to-surface contact may, for example, be made (e.g., simultaneously) by and between the connector blade 1704 (FIG. 17) and the elongated contact pin 104 (FIG. 17), by and between the connector blade 1708 (FIG. 17) and the elongated contact pin 108 (FIG. 17), and by and between the connector blade 1716 and the elongated contact pin 116 (FIG. 17). (In accordance with embodiments of the present disclosure, no such surface-to-surface contact has yet been achieved by and between the connector blade 1706 (FIG. 17) and the elongated contact pin 106 (FIG. 17), by and between the connector blade 1710 and the elongated contact pin 110, by and between the connector blade 1714 (FIG. 17) and the elongated contact pin 114 (FIG. 17), or by and between the connector blade 1718 (FIG. 17) and the elongated contact pin 118 (FIG. 17).)

Still referring to FIG. 18, an ultimate or final (e.g., corresponding to a final connection configuration) point of contact between the connector blade 1712 (FIG. 17) and the elongated connector pin 112 may occur at a point 1802 on the upward-facing surface 442 of the elongated contact pin 112 in a vicinity of an uppermost extent of the main downward bend 170 thereof. (Similar instances of such ultimate or final points of contact may, for example, occur (e.g., simultaneously) by and between the connector blade 1704 (FIG. 17) and the elongated contact pin 104 (FIG. 1), by and between the connector blade 1708 (FIG. 17) and the elongated contact pin 108 (FIG. 1), and by and between the connector blade 1716 (FIG. 17) and the elongated contact pin 116 (FIG. 1).)

An ultimate or final (e.g., corresponding to a final connection configuration) point of contact between the connector blade 1710 and the elongated connector pin 110 may occur at a point 1804 on the upward facing surface 446 of the elongated contact pin 110 in a vicinity of an uppermost extent of the main downward bend 172 thereof (Similar instances of such ultimate or final points of contact may, for example, occur (e.g., simultaneously) by and between the connector blade 1706 (FIG. 17) and the elongated contact pin 106 (FIG. 1), by and between the connector blade 1714 (FIG. 17) and the elongated contact pin 114 (FIG. 1), and by and between the connector blade 1718 (FIG. 17) and the elongated contact pin 118 (FIG. 1).)

Intimate physical contact may already exist as between the downward-facing surface 430 of the elongated connector pin 110 and the upward-facing surface 564 of the elongated interconnection element 554 of the intermediate section 406 of the flexible PCB 400 of the reactance unit 120 at a point 1806 on the downward-facing surface 430 in a vicinity of a lower end of the slanted extent 442. (Similar instances of such intimate physical contact may also already exist as between the elongated contact pin 106 (FIG. 17) and the elongated interconnection element 550 (FIG. 5), as between the elongated contact pin 114 (FIG. 17) and the elongated interconnection element 558 (FIG. 5), and as between the elongated contact pin 118 (FIG. 17) and the elongated interconnection element 562 (FIG. 5).) As shown in FIG. 18, as measured along an axial path of extension defined by the elongated contact pin 110 itself, the point of contact 1806 may be separated from the point of contact 1802 to the extent of an interval 1808. The significance of such points of contact and/or the axial interval between the same will be discussed in greater detail below.

Figure 19:
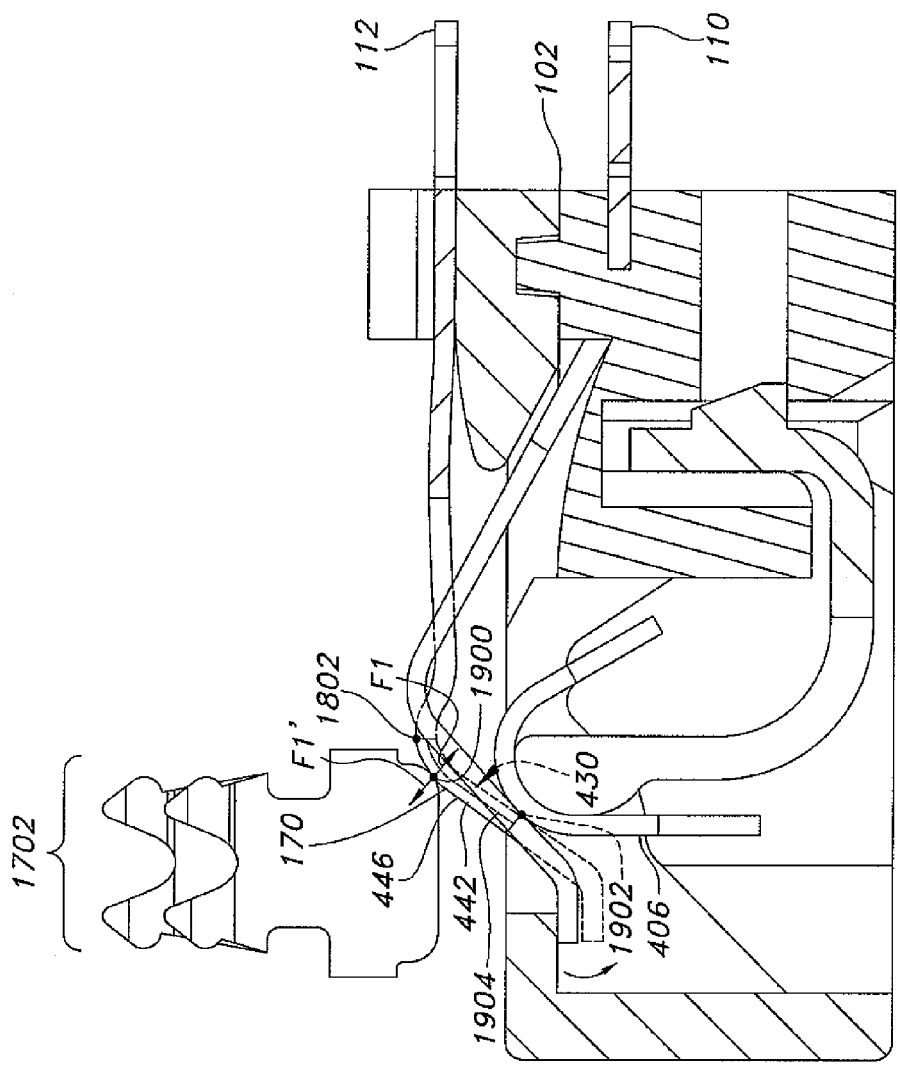

Turning now to FIG. 19, the arrangement 1702 may continue to move axially rearwardly. More particularly, the connector blade 1712 (FIG. 7) has begun impinging upon the elongated contact pin 112, including wherein a force F1 is imparted by the connector blade 1712 to the upward-facing surface 446 of the slanted extent 442, causing a substantially equal and opposite reaction force F1' to be imparted to the connector blade 1712 (FIG. 17), overcoming a preload in the elongated contact pin 112, and causing the slanted extent 442 of the elongated contact pin 112 to rotate or deflect downward relative to the housing 102. The connector blade 1712 (FIG. 17) and the elongated contact pin 112 have moved relative to each other. Surface-to-surface contact between the same, however, has been maintained (e.g., continuous sliding contact between the same). Such surface-to-surface contact may now occur at a point 1900 on the upward-facing surface 442 of the elongated contact pin 112 in a vicinity of a forward portion of the main downward bend 170 thereof (e.g., higher on the upward-facing surface 446 than the point 1800 (FIG. 18)). Similar instances of such surface-to-surface sliding contact may, for example, be being maintained by and between the connector blade 1704 (FIG. 17) and the elongated contact pin 104 (FIG. 17), by and between the connector blade 1708 (FIG. 17) and the elongated contact pin 108 (FIG. 17), and by and between the connector blade 1716 (FIG. 17) and the elongated contact pin 116 (FIG. 17).

Still referring to FIG. 19, an initial instance of intimate physical contact may now exist between the downward-facing surface 430 of the slanted extent 442 of the elongated contact pin 112 and the upward-facing surface 564 (FIG. 5) of the elongated interconnection element 556 (FIG. 5) at a point 1902 on the downward-facing surface 430. Similar initial instances of such surface to surface contact may, for example, be made (e.g., simultaneously) by and between the elongated contact pin 104 (FIG. 17) and the elongated interface element 548 (FIG. 5), by and between the elongated contact pin 108 (FIG. 17) and the elongated interface element 552 (FIG. 5), and by and between the elongated contact pin 1016 (FIG. 17) and the elongated interface element 560 (FIG. 5) 108. As shown in FIG. 19, as measured along an axial path of extension defined by the elongated contact pin 112 itself, the point of contact 1902 may be separated from the point of contact 1804 to the extent of an interval 1904. The significance of such points of contact and/or the axial interval between the same will be discussed in greater detail below.

Figure 20:
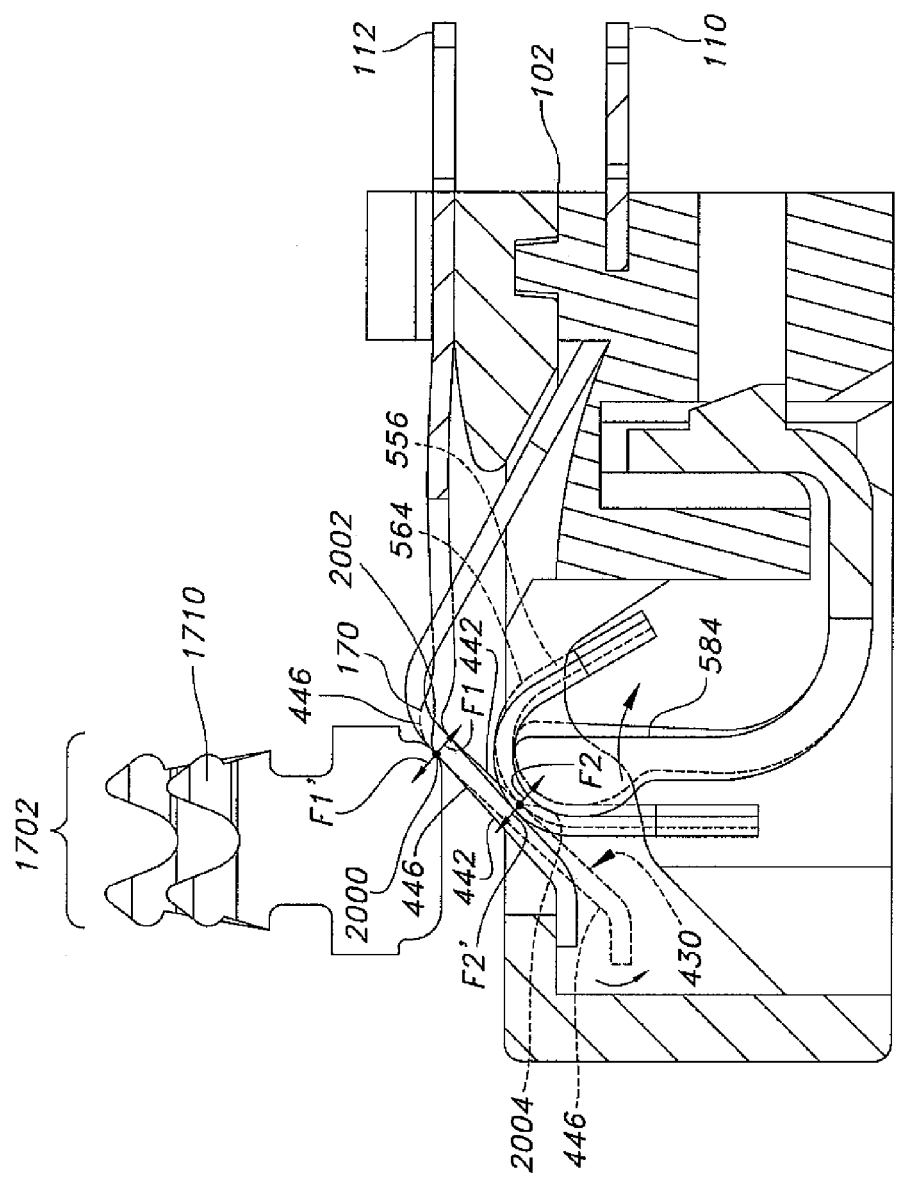

As shown in FIG. 20, the arrangement 1702 may continue to move axially rearwardly. An initial instance of surface-to-surface contact between the connector blade 1710 and the elongated contact pin 110 may occur at a point 2000 on the upward-facing surface 446 of the elongated contact pin 110 in a vicinity of an upper end of the slanted extent 442. Similar such initial instances of surface-to-surface contact may, for example, be made (e.g., simultaneously) by and between the connector blade 1706 (FIG. 17) and the elongated contact pin 106 (FIG. 17), by and between the connector blade 1714 (FIG. 17) and the elongated contact pin 114 (FIG. 17), and by and between the connector blade 1718 (FIG. 17) and the elongated contact pin 118 (FIG. 17).

Still referring to FIG. 20, the connector blade 1712 (FIG. 7) continues to impinge upon the elongated contact pin 112, including wherein the force F1 imparted by the connector blade 1712 (FIG. 17) to the upward-facing surface 446 of the elongated contact pin 112 has, in concert with the reaction force F1' imparted to the connector blade 1712, increased in magnitude, causing the slanted extent 442 of the elongated contact pin 112 to rotate or deflect still her downward relative to the housing 102, wherein corresponding surface-to-surface contact has accordingly moved once again, now occurring at a point 2002 (coinciding with the point 2000 in the side view of FIG. 20) on the upward-facing surface 446 of the elongated contact pin 112 in a vicinity of a middle portion of the main downward bend 170 (e.g., higher on the upward-facing surface 446 than the point 1900 (FIG. 19)). Similar such instances of surface-to-surface sliding contact may, for example, be being maintained by and between the connector blade 1704 (FIG. 17) and the elongated contact pin 104 (FIG. 17), by and between the connector blade 1708 (FIG. 17) and the elongated contact pin 108 (FIG. 17), and by and between the connector blade 1716 (FIG. 17) and the elongated contact pin 116 (FIG. 17).

As shown in FIG. 20, the elongated contact pin 112 has begun impinging upon the flexible PCB 400, including wherein a force F2 is imparted by the slanted extent 442 to the upward-facing surface 564 of the elongated interconnection element 556, causing a substantially equal and opposite reaction force F2' to be imparted to the downward-facing surface 430 of the elongated contact pin 112, overcoming a preload in the elongated support element 584, and causing the elongated support element 584 to rotate or deflect (e.g., via elastic deformation based on the cantilever-type support arrangement with respect to the housing 102) to at least some extent upwardly, and to at least some extent rearwardly, relative to the housing 102. The elongated contact pin 112 and the elongated interconnection element 556 have moved relative to each other. Surface-to-surface contact between the same, however, has been maintained (e.g., continuous sliding contact between the same). Such surface-to-surface contact may now occur at a point 2004 on the downward-facing surface 130 of the elongated contact pin 112 in a vicinity of a middle portion of the slanted extent 442 (e.g., higher on the downward-facing surface 130 than the point 1902 (FIG. 19)). Similar instances of such surface-to-surface sliding contact may, for example, be being maintained by and between the elongated contact pin 104 (FIG. 17) and the elongated interface element 548 (FIG. 5), by and between the elongated contact pin 108 (FIG. 17) and the elongated interface element 552 (FIG. 5), and by and between the elongated contact pin 1016 (FIG. 17) and the elongated interface element 560 (FIG. 5) 108.

Figure 21:
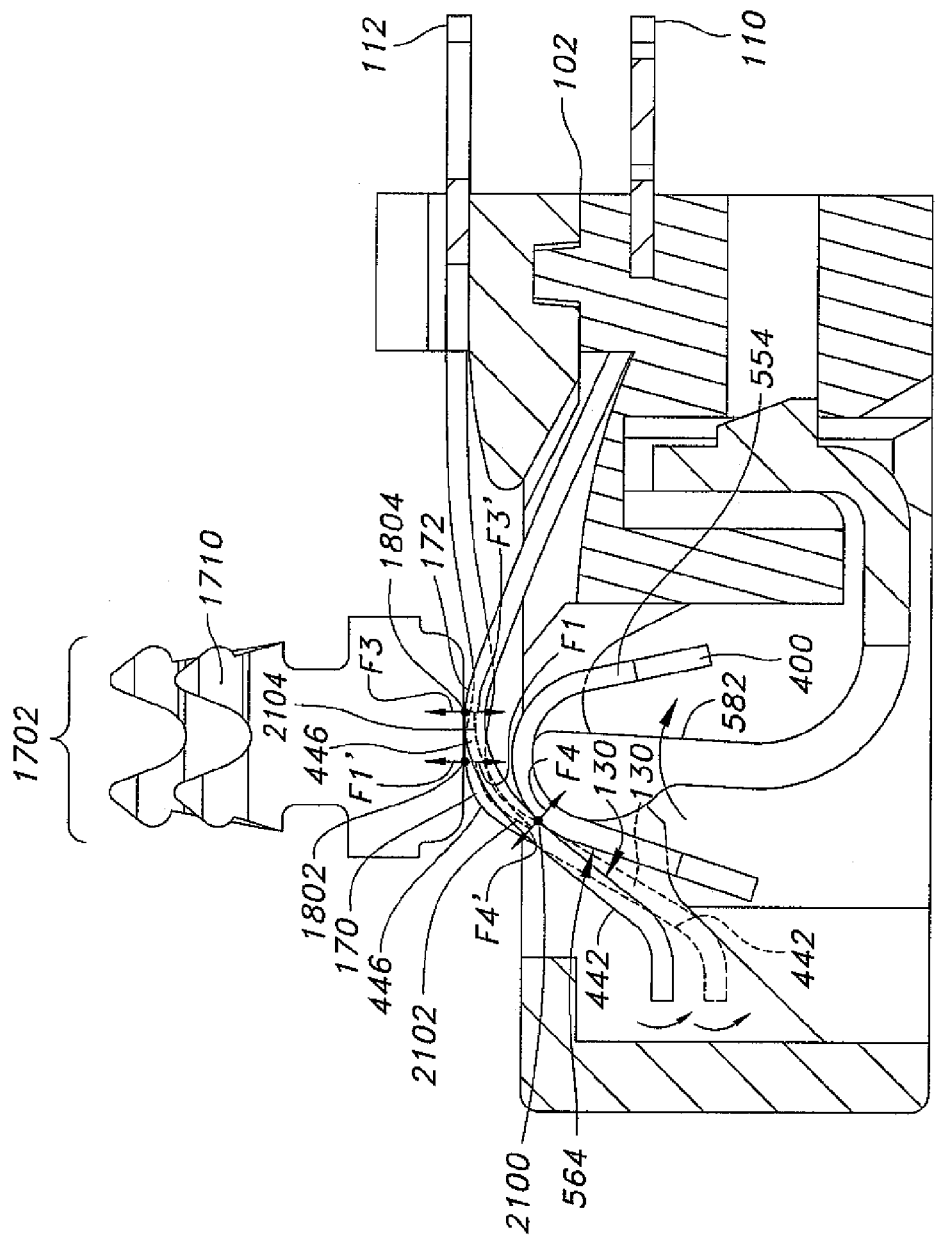

Turning now to FIG. 21, the arrangement 1702 may continue to move axially rearwardly to a final position atop the elongated contact pins of the arrangement 103 (FIG. 1). More particularly, the connector blade 1712 (FIG. 7), continues to impinge upon the elongated contact pin 112, including wherein the force F1 imparted by the connector blade 1712 to the upward-facing surface 446 of the slanted extent 442 has increased still further in magnitude together with the reaction force F1', causing the slanted extent 442 of the elongated contact pin 112 to rotate or deflect still further downward relative to the housing 102, wherein corresponding surface-to-surface contact has moved again, now occurring at the point 1802 on the upward-facing surface 446 of the elongated contact pin 112 in the vicinity of the uppermost extent of the main downward bend 170 thereof. The elongated contact pin 112 (FIG. 7) continues to impinge upon the elongated interconnection element 556 (FIG. 20), including wherein a force (not separately shown) imparted to the upward-facing surface 564 (FIG. 20) of the elongated interconnection element 556 has increased still further in magnitude together with the corresponding reaction force (not separately shown), causing the elongated support element 584 (FIG. 20) to rotate or deflect still further upwardly and rearwardly relative to the housing 102, wherein corresponding surface-to-surface contact has moved yet again, now occurring in a vicinity of an upper portion of the slanted extent 442 of the elongated contact pin 112 (e.g., higher on the downward-facing surface 130 than the point 2004 (FIG. 20)). Similar instances of such surface-to-surface sliding contact may, for example, be being maintained by and between the elongated contact pin 104 (FIG. 17) and the elongated interface element 548 (FIG. 5), by and between the elongated contact pin 108 (FIG. 17) and the elongated interface element 552 (FIG. 5), and by and between the elongated contact pin 1016 (FIG. 17) and the elongated interface element 560 (FIG. 5).

Still referring to FIG. 21, the connector blade 1710 has impinged upon the elongated connector pin 110, including wherein a force F3 is imparted by the connector blade 1710 to the upward-facing surface 446 of the slanted extent 442 of the elongated connector pin 110, causing a substantially equal and opposite force F3' to be imparted to the connector blade 1710, overcoming a preload in the elongated contact pin 110, and causing the slanted extent 442 of the elongated contact pin 110 to rotate or deflect downward relative to the housing 102. The connector blade 1710 and the elongated contact pin 110 have moved relative to each other. Surface-to-surface contact between the same, however, has been maintained (e.g., continuous sliding contact between the same). Such surface-to-surface contact may eventually occur at the point 1804 on the upward-facing surface 446 of the elongated contact pin 110 in the vicinity of the uppermost extent of the main downward bend 172 thereof. (Similar instances of such surface-to-surface sliding contact may, for example, be being maintained by and between the connector blade 1706 (FIG. 17) and the elongated contact pin 106 (FIG. 17), by and between the connector blade 1714 (FIG. 17) and the elongated contact pin 114 (FIG. 17), and by and between the connector blade 1718 (FIG. 17) and the elongated contact pin 118 (FIG. 17).

The elongated contact pin 110 has impinged upon the flexible PCB 400, including wherein a force F4 is imparted by the slanted extent 442 of the elongated contact pin 110 to the upward-facing surface 564 of the elongated interconnection element 554, causing a substantially equal and opposite reaction force F4' to be imparted to the downward-facing surface 430 of the slanted extent 442, overcoming a preload in the elongated support element 582, and causing the elongated support element 582 to rotate or deflect (e.g., via elastic deformation based on the cantilever-type support arrangement with respect to the housing 102) to at least some extent upwardly, and to at least some extent rearwardly, relative to the housing 102. The elongated contact pin 110 and the elongated interconnection element 554 have moved relative to each other. Surface-to-surface contact between the same, however, has been maintained (e.g., continuous sliding contact between the same). Such surface-to-surface contact may now occur at a point 2100 on the downward-facing surface 130 of the elongated contact pin 110 in a vicinity of an upper portion of the slanted extent 442 (e.g., higher on the downward-facing surface 130 than the point 1806 (FIG. 18). Similar instances of such surface-to-surface sliding contact may, for example, be being maintained by and between the elongated contact pin 106 (FIG. 17) and the elongated interface element 550 (FIG. 5), by and between the elongated contact pin 114 (FIG. 17) and the elongated interface element 558 (FIG. 5), and by and between the elongated contact pin 1018 (FIG. 17) and the elongated interface element 562 (FIG. 5).

As shown in FIG. 21, as measured along the axial path of extension defined by the elongated contact pin 112, the point of contact 2100 (which for present purposes is considered to approximate a position of a point of contact between the elongated contact pin 112 (FIG. 5) and the elongated interconnection element 556) may be separated from the point of contact 1802 to the extent of an interval 2102, wherein at least partially based the elongated contact pin 112 and the elongated interconnection element 556 having moved relative to each other, the interval 2102 is shorter than the interval 1904 (FIG. 19). As measured along the axial path of extension defined by the elongated contact pin 110, the point of contact 2100 may be separated from the point of contact 1804 to the extent of an interval 2104, wherein at least partially based the elongated contact pin 10 and the elongated interconnection element 554 having moved relative to each other, the interval 2104 is shorter than the interval 1808 (FIG. 19).

Figure 22:
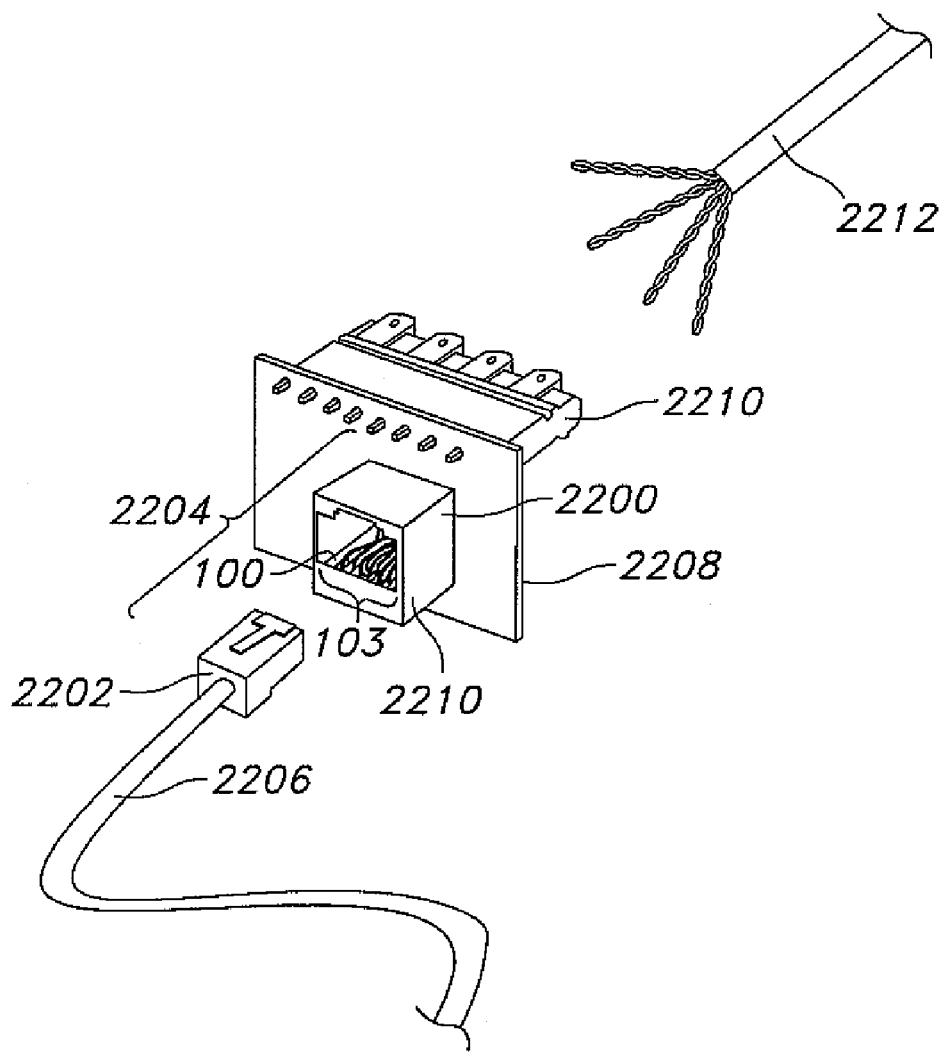
FIG. 22 is a schematic perspective view of a connection system in accordance with embodiments of the present disclosure, the connection system including a jack assembly that incorporates the exemplary insert device of FIG. 1.

FIG. 22 illustrates a use of exemplary insert devices and modular jacks in accordance with the present disclosure. A modular jack 2200 and a plug 2202 form a connection system 2204 for passing signals from a cable 2206 to a printed circuit board (PCB) 2208. The cable 2206 may be, for example, a UTP cable, and the plug 2202 may be, for example, an RJ45-type plug. The modular jack 2200 may include a jack housing 2210 and an instance of the insert device 100 of FIG. 1, wherein the latter may be secured in the jack housing 2210. The elongated contact pins of the arrangement 103 of the insert device 100 may be configured and adapted to interact with corresponding contacts (obscured) associated with the plug 2202 so as to allow the plug 2202 to mate with the modular jack 2200 and form the connection system 2204.

The jack housing 2210 may be mounted to the PCB 2208, including wherein the insert device 100 may be electrically connected to the PCB 2208. For example, the proximal ends 710 (FIG. 7) of the elongated contact pins of the arrangement 103 may be electrically and mechanically connected to the PCB 2208. The PCB 2208 may contain signal transmission traces and/or extra coupling circuitry for re-balancing signals. Signals may transfer from the cable 2206 and into the insert device 100 via the plug 2202, and from the insert device 100 to the PCB 2208 via the elongated contact pins of the plurality 103. The signals may be transferred from the PCB 2208 to insulation displacement contacts (IDC's) 2212 which are connected to a second cable 2214 (e.g., a second UTP cable), thus completing the data interface and transfer through the insert device 100.

Referring to FIGS. 1-22, the design and operation of the conductors 900, 902, 904, 906, 1000, 1002, 1004, 1006, 1200, 1202, 1204, 1206, 1300, 1302, 1304, 1306, 1500, 1502, 1504, 1506, 1600, 1602, 1604, and 1608 to deliver an appropriate level of compensation to the insert device 100 (FIG. 1) is within the skill level of ordinary practitioners in the field. The capacitive contributions from conductors 900, 902, 904, 906, 1000, 1002, 1004, 1006, 1200, 1202, 1204, 1206, 1300, 1302, 1304, 1306, 1500, 1502, 1504, 1506, 1600, 1602, 1604, and 1608 may be balanced with other compensation contributors associated with the overall design and operation of the presently disclosed modular jacks. Thus, for example, any compensation generated by a PCB (not shown) in electrical communication with the proximal ends 710 (FIG. 7) of the elongated contact pins 104, 106, 108, 110, 112, 114, 116, and 118 may be considered in sizing, positioning, and otherwise configuring the conductors 900, 902, 904, 906, 1000, 1002, 1004, 1006, 1200, 1202, 1204, 1206, 1300, 1302, 1304, 1306, 1500, 1502, 1504, 1506, 1600, 1602, 1604, and 1608 so as to offset the noise introduced by reason of the plug/jack interconnection.

The spacing of the elongated contact pins 104, 106, 108, 110, 112, 114, 116, and 118, e.g., at the proximal end 122, may be selected so as to minimize potential crosstalk noise. Thus, for example, in the upper plurality, the distance between the elongated contact pins 116 and 112 may be about 0.190 inch, between the elongated contact pins 112 and 108 may range from about 0.050 to 0.060 inches, and between the elongated contact pins 108 and 104 may be about 0.1 inch. In the lower plurality, the distance between the elongated contact pins 118 and 114 may be about 0.1 inch, between the elongated contact pins 114 and 110 may range from about 0.050 to 0.060 inches, and between the elongated contact pins 110 and 106 may be about 0.190 inch. The distance between the upper and lower pluralities of elongated contact pins may be at least about 0.1 inch. This arrangement may serve to reduce the pair to pair noise, which may be introduced to the system by the TIA/EIA T568B/A plug, among other things.

In exemplary embodiments of the present disclosure, the elongated contact pins 104, 108, 112, and 116 of the lower plurality may be designated ring R' (i.e., negative voltage transmission) polarity and the elongated contact pins 106, 110, 114, and 118 of the upper plurality may be designated tip T' (i.e., positive voltage transmission) polarity. For T568B category 5c and 6 frequencies, unwanted noise may be induced mainly between elongated contact pins 108, 110, 112, and 114, and minor unwanted noises may be introduced between elongated contact pins 104 and 106 as well as elongated contact pins 116 and 118.

Elongated contact pins 104, 106, 108, 110, 112, 114, 116, and/or 118 may be electrically short in reference to the wavelengths up to 500 MHz. By positioning the capacitance structures, e.g., the conductors 900, 902, 904, 906, 1200, 1202, 1204, 1206, 1500, 1502, 1504, and 1506 and their mirror sets 1000, 1002, 1004, 1006, 1300, 1302, 1304, 1306, 1600, 1602, 1604, and 1608 for example, in close proximity to the source of the crosstalk noise, the offset regions are reduced. Rebalancing the original signal to remove the noise signal is best achieved by using a signal of opposite polarity than the originating noise signal. For example, an optimal point for creation of a rebalancing signal may be within 0.2 inches of the noise creation, because such a point may provide substantially equivalent magnitude and phase to the original negative noise region, among other things. The disclosed insert devices, including but not limited to the insert device 100, are particularly advantageous and effective in satisfying or approaching this desired proximity.

Elongated contact pins 104, 106, 108, 110, 112, 114, 116, and/or 118 may be generally arranged in a manner to reduce unwanted noise via coupling in EIA RJ45 T568B having standard plug positions 1, 2, 3, 4, 5, 6, 7, 8, particularly as compared to standard RJ45 modular inserts. This reduction in unwanted noise generation is achieved, in part, by reducing the degree to which lead frame are maintained in a parallel/adjacent orientation as compared to standard RJ45 modular inserts.

Engagement and energizing of the compensation functionality associated with the elongated contact pins 106, 110, 114, and 118 of the upper plurality may only occur when the insert device 100 is mated with an EIA RJ45 T568B standard plug (or structurally similar/comparable plug) with positions 1, 2, 3, 4, 5, 6, 7, 8 in use, i.e., occupied by a corresponding contact.

The end result may be an insert device that has lower NEXT, FEXT and impedance in certain wire pairs. The reduction of a majority of crosstalk noise may, for example, occur by combining a first movable reactance section with indirect and direct signal coupling in the lead frames associated with central pairs 1 and 3, as well as the other pairs 2 and 4 in the RJ45 plug.

The elongated contact pins may be generally electrically short (e.g., approximately less than 0.27 inches in length), which may serve to reduce the negative noise coupling by reducing the parallelism of the adjacent victim wire and reducing the signal delay to a PCB that could contain further coupling circuitry. The additive positive noise and reduction of the unwanted negative noise coupling of the elongated contact pins may work at substantially the same moment in time, which allows optimal reduction for lower capacitive and inductive coupling. The combination of the split signals may provide, inter alia, an enhanced low noise dielectric modular housing for high speed telecommunication connecting hardware systems. The end result may be a modular insert device that has lower NEXT, FEXT and impedance within its wire pairs.

Insert devices/jacks fabricated according to the present disclosure may be effective to reduce the differential noise input voltage ratio signal by at least fifty percent. This reduction and controlled compensation Xc also aid in reducing the cabling Power Sum Alien Crosstalk (PSANEXT). By reducing the NEXT noise, the disclosed systems/methods also reduce the amount of coupling energy that has the potential to radiate upon an adjacent line. PSANEXT (as described in the EIA 568-B.2-10 document) is a new noise parameter that has a limited margin requirement for proper 10GBASE-T signal transmission over copper cabling.

The extent to which the interval 1904 is shorter than the interval 2102, and/or the extent to which the interval 2104 is shorter than the interval 1808, may represent a reduction in the axial length of an electrical path between a source of electrical noise (e.g., the pin/blade interface) and the circuitry embodied by the flexible PCB 400 for reducing and/or compensating for such electrical noise. In accordance with embodiments of the present disclosure, a corresponding reduction in the axial length of an electrical path between the pin/blade interface associated with the elongated contact pins 106, 110, 114, and 118 of the lower plurality may be achieved having an extent of at least about 0.030 inches (e.g., an extent falling in a range of between about 0.040 inches and about 0.045 inches), and/or a corresponding reduction in the axial length of an electrical path between the pin/blade interface associated with the elongated contact pins 104, 108, 112, and 116 of the upper plurality may be achieved having an extent of at least about 0.030 inches (e.g., an extent falling in a range of between about 0.040 inches and about 0.045 inches). Such reductions in the axial length of electrical path may arise from one or more of a plurality of factors during the plug/jack mating sequence, including but not limited to vertical and horizontal motion of the flexible PCB 400 relative to the housing 102, inserted plug x-axis displacement, and/or modular contact blade internal alignment that may occur during plug/jack mating.

Referring now to FIGS. 1, 4, 5, 17, 18 and 21, in accordance with embodiments of the present disclosure, at an initial position (e.g., an "at rest" position absent any mating plug (e.g., as shown in FIGS. 1 and 4), and/or upon initial contact with mating connector blades of a plug (e.g., as shown in FIG. 18) prior to a final mating connection being established), respective instances of physical contact may already exist as between the elongated contact pins 104, 108, 112, and 116 of the upper plurality and the corresponding elongated interconnection elements 548, 552, 556, and 560 of the flexible PCB 400, while the elongated contact pins 106, 110, 114, and 118 of the lower plurality may be (e.g., at least initially) physically isolated (e.g., separated by a spatial gap) from the corresponding elongated interconnection elements 550, 554, 558, and 562 of the flexible PCB 400. Such an arrangement may be advantageous at least insofar as it may facilitate the development of a compact mechanical design for ensuring that at the final assembled position shown in FIGS. 17 and 21, the elongated contact pins 104, 106, 108, 110, 112, 114, 116, and 118 will be at an equal plane with the plug connector blades 1704, 1706, 1708, 1710, 1712, 1714, 1716, and 1718 (e.g., for purposes of establishing and/or maintaining a respectively separate instance of intimate physical contact between each corresponding pin/blade pair), and at an equal plane with the elongated interconnection elements 548, 550, 552, 554, 556, 558, 560, and 562 (e.g., for purposes of establishing and/or maintaining a respectively separate instance of intimate physical contact between each corresponding pin/element pair), simultaneously.

In accordance with embodiments of the present disclosure, one, two or more, or all, of the above-described respectively separate instances of intimate physical contact between each corresponding pin/element pair existing at the initial position (e.g., an "at rest" position absent any mating plug (e.g., as shown in FIGS. 1 and 4), and/or upon initial contact with mating connector blades of a plug (e.g., as shown in FIG. 18) prior to a final mating connection being established), may further be such as to create a corresponding separate instance of direct electrical communication therebetween. Alternatively, or in addition, one, two or more, or all, of the above-described respectively separate instances of intimate physical contact between each corresponding pin/element pair existing at the initial position (e.g., an "at rest" position absent any mating plug (e.g., as shown in FIGS. 1 and 4), and/or upon initial contact with mating connector blades of a plug (e.g., as shown in FIG. 18) prior to a final mating connection being established) may further be such as to prevent or otherwise preclude (e.g., via the presence of an intervening layer or quantity of an electrically insulative material) a corresponding separate instance of direct electrical communication therebetween. At least some examples of such latter embodiments may include wherein upon a sufficient extent of relative motion (e.g., sliding motion in which intimate physical contact is maintained) between the contact pins and the interconnection elements away from their original contact positions (e.g., corresponding to the final mating position depicted in FIGS. 17 and 21), such direct electrical communication is eventually established. At least some other examples of such latter embodiments may include wherein no amount of relative motion between the contact pins and the interconnection elements is sufficient to establish such direct electrical communication.

Although the systems, apparatus and methods have been described with respect to exemplary embodiments herein, it is apparent that modifications, variations, changes and/or enhancements may be made thereto without departing from the spirit or scope of the invention as defined by the appended claims. Accordingly, the present disclosure expressly encompasses all such modifications, variations, changes and/or enhancements.

The invention claimed is:

1. An insert device for use in a communication jack, comprising:
   a housing including walls defining an interior space;
   a plurality of plug interface contacts mounted with respect to the housing, including wherein at least one plug interface contact of the plurality thereof includes a first length extent extending along a first axial path and defining a first reaction surface that includes a first electrically conductive surface; and
   a reactance unit including a reactance circuit at least partially disposed within the interior space of the housing and operable to at least one of reduce and compensate for an electrical noise associated with signals conducted by the plug interface contacts of the plurality thereof, the reactance circuit further including a printed circuit board having an interconnection section including a plurality of interconnection elements and an end section including a plurality of capacitive elements in electrical communication with the interconnection elements of the plurality thereof, including wherein at least one interconnection element of the plurality thereof defines a second reaction surface that includes a second electrically conductive surface;
   wherein the insert device is operable to move the reactance circuit, including the interconnection section of the printed circuit board and the end section of the printed circuit board, relative to the at least one plug interface contact, and relative to the housing, by sliding the second reaction surface across the first reaction surface along an axial direction corresponding to the first axial path; and
   wherein the insert device is operable to press the second electrically conductive surface against the first electrically conductive surface with a force sufficient to preserve direct electrical communication between the reactance circuit and the at least one plug interface contact.

2. The insert device of claim 1, wherein the interior space of the housing includes a plurality of elongated channels, including wherein at least one elongated channel of the plurality thereof includes walls dimensioned and adapted to receive and guide a movement of a corresponding instance of the first length extent of the at least one plug interface contact.

3. The insert device of claim 1, wherein the interior space of the housing includes a plurality of elongated channels, including wherein at least one elongated channel of the plurality thereof includes walls dimensioned and adapted to receive and guide a movement of a corresponding instance of the at least one interconnection element of the reactance circuit.

4. The insert device of claim 1, wherein the insert device is operable to move the second electrically conductive surface between a first position relative to the first electrical conductive surface in which the function of the reactance circuit to at least one of reduce and compensate for the electrical noise is deactivated and a second position relative to the first electrical conductive surface in which the function of the reactance circuit to at least one of reduce and compensate for the electrical noise is activated.

5. The insert device of claim 1, wherein the insert device is operable to move the second reaction surface between a first position relative to each other the first electrically conductive surface in which the first and second electrically conductive surfaces are electrically isolated and a second position relative to the first electrical conductive surface in which the first and second electrically conductive surfaces are in electrical communication with each other.

6. The insert device of claim 1, wherein the insert device is operable to maintain the first and second reaction surfaces in direct physical communication with each other while moving the second reaction surface between a first position relative to the first reaction surface in which the first and second electrically conductive surfaces are physically isolated from each other, and a second position relative to the first reaction surface in which the first and second reaction surfaces are in direct physical communication with each other.

7. The insert device of claim 1, wherein the insert device is operable to move the second reaction surface between and among a first position relative to the first reaction surface in which the first and second reaction surfaces are physically isolated from each other, a second position relative to the first reaction surface in which the first and second reaction surfaces are in direct physical communication with each other but the first and second electrically conductive surfaces are electrically isolated from each other, and a third position relative to the first reaction surface in which the first and second reaction surfaces are in direct physical combination with each other and the first and second reaction electrically conductive surfaces are in electrical communication with each other.

8. The insert device of claim 1, wherein the housing includes an upper portion and a lower portion that cooperate to capture and support the plug interface contacts of the plurality thereof.

9. The insert device of claim 1, wherein the at least one plug interface contact includes eight (8) plug interface contacts in a side-by-side arrangement at least one end of the housing.

10. The insert device of claim 1, wherein the reactance unit includes a frame for supporting the reactance circuit relative to the at least one plug interface contacts, the frame incorporating at least one of a cantilever spring and a coil spring for so pressing the second electrically conductive surface against the first electrically conductive surface.

11. The insert device of claim 1, wherein the insert device is operable to move the reactance circuit relative to the at least one plug interface contact at least in part by causing the reactance circuit to rotate one of clockwise and counterclockwise in response to the at least one plug interface contact is rotating the other of clockwise and counterclockwise.

12. The insert device of claim 1, wherein the insert device is operable to move the reactance circuit relative to the at least one plug interface contact at least in part by causing the reactance circuit to translate vertically upward in response to the at least one plug interface contact translating vertically downward.

13. The insert device of claim 1, wherein the insert device is operable to move the reactance circuit relative to the at least one plug interface contact at least in part by causing the reactance circuit to rotate vertically upward and rearward in response to the at least one plug interface contact rotating vertically downward.

14. The insert device of claim 1, wherein the reactance circuit is free floating with respect to the plug interface contacts of the plurality thereof.

15. The insert device of claim 14, wherein the reactance circuit is adapted to move relative to the plug interface contacts of the plurality thereof in at least one of the vertical direction, the axial horizontal direction, or both.

16. The insert device of claim 1, wherein the reactance circuit is free floating with respect to the housing.

17. The insert device of claim 16, wherein the reactance circuit is adapted to move relative to the housing in at least one of the vertical direction, the axial horizontal direction, or both.

18. The insert device of claim 1, wherein the printed circuit board is a flexible printed circuit board, and wherein the capacitive elements of the plurality of capacitive elements associated with the end section of the printed circuit board are formed via conductive layers of the flexible printed circuit board.

19. The insert device of claim 18, wherein the capacitive elements of the plurality of capacitive elements associated with the end section of the flexible circuit board include at least one of capacitive pad traces, capacitive plate traces, and capacitive interdigitated traces.

20. The insert device of claim 1, wherein the reactance unit includes a frame for supporting the reactance circuit relative to the at least one plug interface contacts, the frame including a base securely mounted with respect to the housing and a plurality of flexible support elements receiving cantilever-type support from the base and extending outward therefrom, each flexible support element being operable to support an individual one of the at least one interconnection element.

21. The insert device of claim 20, wherein each flexible support element terminates in a rounded distal tip, and wherein each individual one of the at least one interconnection element is form bent to conform to a shape of the rounded distal tip of the corresponding flexible support element.

22. The insert device of claim 1, wherein by sliding the second reaction surface across the first reaction surface along an axial direction corresponding to the first axial path, the insert device operates to adjust an electrical distance along the first axial path between a point of contact of the reactance circuit with the at least one plug interface contact and a point of contact of the at least one plug interface with a corresponding instance of a jack interface blade of a mating communication plug.

23. The insert device of claim 22, wherein the insert device is operable to adjust the electrical distance along the first axial path at least to an extent of at least about 0.030 inches.

24. The insert device of claim 22, wherein the insert device is operable to adjust the electrical distance along the first axial path to an extent falling in a range of between about 0.040 inches and 0.045 inches.

25. The insert device of claim 22, wherein by sliding the second reaction surface across the first reaction surface along an axial direction corresponding to the first axial path, the insert device operates to one of foreshorten the electrical distance along the first axial path, lengthen the electrical distance along the first axial path, or both.

26. A jack assembly, comprising:
a jack housing defining a plug-receiving space; and
an insert device positioned within the jack housing, the insert device including
an insert housing;
a plurality of plug interface contacts mounted with respect to the insert housing, including wherein at least one plug interface contact of the plurality thereof includes a first length extent extending along a first axial path and defining a first reaction surface that includes a first electrically conductive surface; and
a reactance unit including a reactance circuit at least partially disposed within the interior space of the housing and operable to at least one of reduce and compensate for an electrical noise associated with signals conducted by the plug interface contacts of the plurality thereof, the reactance circuit further including a plurality of interconnection elements, and a plurality of capacitive elements in electrical communication with the interconnection elements of the plurality thereof; including wherein at least one interconnection element of the plurality thereof defines a second reaction surface that includes a second electrically ! conductive surface;
wherein in response to a mating plug being received in the plug receiving space of the jack housing, the insert device is operable to move the plurality of interconnection elements of the reactance circuit and the plurality of capacitive elements of the reactance circuit relative to the at least one plug interface contact and relative to the housing by sliding the second reaction surface across the first reaction surface along an axial direction corresponding to the first axial path, and to press the second electrically conductive surface against the first electrically conductive surface with a force sufficient to preserve direct electrical communication between the reactance circuit and the at least one plug interface contact.

27. The jack assembly of claim 26, wherein in response to a mating plug being received in the plug receiving space of the jack housing, the insert device is operable to move the second electrically conductive surface between a first position relative to the first reaction surface in which the function of the reactance circuit to at least one of reduce and compensate for the electrical noise is deactivated and a second position relative to the first electrically conductive surface which the function of the reactance circuit to at least one of reduce and compensate for the electrical noise is activated.

28. The jack assembly of claim 26, wherein in response to a mating plug being received in the plug receiving space of the jack housing, the insert device is operable to move the second reaction surface between a first position relative to the first reaction surface in which the first and second electrically conductive surfaces are electrically isolated and a second position relative to the first reaction surface in which the first and second electrically conductive surfaces are in electrical communication with each other.

29. The jack assembly of claim 26, wherein the insert device is operable to maintain the first and second reaction surfaces in direct physical communication with each other while moving the second reaction surface between a first position relative to the first reaction surface in which the first and second electrically conductive surfaces are physically isolated from each other, and a second position relative to the first reaction surface in which the first and second reaction surfaces are in direct physical communication with each other.

30. The jack assembly of claim 26, wherein in response to a mating plug being received in the plug receiving space of the jack housing, the insert device is operable to move the second reaction surface between and among a first position relative to each other the first reaction surface in which the first and second reaction surfaces are physically isolated from each other, a second position relative to the first reaction surface in which the first and second reaction surfaces are in direct physical communication with each other but the first and second electrically conductive surfaces are electrically isolated from each other, and a third position relative to the first reaction surface in which the first and second reaction surfaces are in direct physical communication with each other and the first and second electrical conductive surfaces are in electrical communication with each other.

31. The jack assembly of claim 26, wherein the printed circuit board is a flexible printed circuit board, and wherein the capacitive elements of the plurality of capacitive element associated with the end section of the flexible printed circuit board are formed via conductive layers of the flexible circuit board.

32. The jack assembly of claim 26 wherein the insert device is operable to move the reactance circuit relative to the at least one plug interface contact at least in part by causing the reactance circuit to rotate one of clockwise and counterclockwise in response to the at least one plug interface contact is rotating the other of clockwise and counterclockwise.

33. The jack assembly of claim 26, wherein in response to a mating plug being received in the plug receiving space of the jack housing, the insert device is operable to move the reactance circuit relative to the at least one plug interface contact at least in part by causing the reactance circuit to translate vertically upward in response to the at least one plug interface contact translating vertically downward.

34. The jack assembly of claim 26, wherein in response to a mating plug being received in the plug receiving space of the jack housing, the insert device is operable to move the reactance circuit relative to the at least one plug interface contact, and relative to the housing at least in part by causing the printed circuit board to rotate vertically upward and rearward in response to the at least one plug interface contact rotating vertically downward.

35. The jack assembly of claim 26, wherein the reactance circuit is free floating with respect to the plug interface contacts of the plurality thereof.

36. The jack assembly of claim 35, wherein the reactance circuit is adapted to move relative to the plug interface contacts of the plurality thereof in at least one of the vertical direction, the axial horizontal direction, or both.

37. The Jack assembly of claim 26, wherein the reactance circuit is free floating with respect to the insert housing.

38. The jack assembly of claim 37, wherein the reactance circuit is adapted to move relative to the housing in at least one of the vertical direction, the axial horizontal direction, or both.

39. The jack assembly of claim 26, wherein in response to a mating plug being received in the plug receiving space of the jack housing, the insert device is operable to adjust an electrical distance along the first axial path between a point of contact of the reactance circuit with the at least one plug interface contact and a point of contact of the at least one plug interface with a corresponding instance of a jack interface blade of a mating communication plug.

40. The jack assembly of claim 39, wherein the insert device is operable to adjust the electrical distance along the first axial path at least to an extent of at least about 0.030 inches.

41. The jack assembly of claim 39, wherein the insert device is operable to adjust the electrical distance along the first axial path to an extent falling in a range of between about 0.040 inches and 0.045 inches.

42. The jack assembly of claim 39, wherein by sliding the second reaction surface across the first reaction surface along an axial direction corresponding to the first axial path, the insert device operates to one of foreshorten the electrical distance along the first axial path, lengthen the electrical distance along the first axial path, or both.

\* \* \* \* \*